US007662706B2

(12) United States Patent
Samuelson et al.

(10) Patent No.: US 7,662,706 B2
(45) Date of Patent: Feb. 16, 2010

(54) NANOSTRUCTURES FORMED OF BRANCHED NANOWHISKERS AND METHODS OF PRODUCING THE SAME

(75) Inventors: Lars Ivar Samuelson, Malmo (SE); Knut Wilfried Deppert, Lund (SE)

(73) Assignee: QuNano AB, Lund (SE)

( * ) Notice: Subject to any disclaimer, the term of this patent is extended or adjusted under 35 U.S.C. 154(b) by 809 days.

(21) Appl. No.: 10/986,438

(22) Filed: Nov. 12, 2004

(65) Prior Publication Data
US 2006/0057360 A1 Mar. 16, 2006

Related U.S. Application Data

(60) Provisional application No. 60/524,890, filed on Nov. 26, 2003, provisional application No. 60/560,701, filed on Apr. 9, 2004.

(51) Int. Cl.
*C30B 29/62* (2006.01)

(52) U.S. Cl. ............... 438/503; 438/960; 438/962; 257/E21.036; 117/87; 117/921; 977/754; 977/891

(58) Field of Classification Search ............... 117/87, 117/903, 921–923; 438/479, 503, 507, 960, 438/962; 977/754, 890–891

See application file for complete search history.

(56) References Cited

U.S. PATENT DOCUMENTS 5,858,862 A * 1/1999 Westwater et al. ......... 438/503
6,855,202 B2 * 2/2005 Alivisatos et al. ............ 117/68
7,182,812 B2 * 2/2007 Sunkara et al. ............ 117/103
7,294,417 B2 * 11/2007 Ren et al. ................... 428/701
7,335,908 B2 * 2/2008 Samuelson et al. ........... 257/12
2003/0102444 A1 6/2003 Deppert et al.

(Continued)

FOREIGN PATENT DOCUMENTS

WO WO 01/84238 A1 * 11/2001

OTHER PUBLICATIONS

Dai, Z.R., et al. "Novel Nanostructures of Functional Oxides Synthesized by Thermal Evaporation." Adv. Funct. Mater., vol. 13, No. 1 (Jan. 2003): pp. 9-24.*

(Continued)

*Primary Examiner*—Douglas M Menz
*Assistant Examiner*—Matthew W Such
(74) *Attorney, Agent, or Firm*—Foley & Lardner LLP

(57) ABSTRACT

A method of forming a nanostructure having the form of a tree, comprises a first stage and a second stage. The first stage includes providing one or more catalytic particles on a substrate surface, and growing a first nanowhisker via each catalytic particle. The second stage includes providing, on the periphery of each first nanowhisker, one or more second catalytic particles, and growing, from each second catalytic particle, a second nanowhisker extending transversely from the periphery of the respective first nanowhisker. Further stages may be included to grow one or more further nanowhiskers extending from the nanowhisker(s) of the preceding stage. Heterostructures may be created within the nanowhiskers. Such nanostructures may form the components of a solar cell array or a light emitting flat panel, where the nanowhiskers are formed of a photosensitive material. A neural network may be formed by positioning the first nanowhiskers close together so that adjacent trees contact one another through nanowhiskers grown in a subsequent stage, and heterojunctions within the nanowhiskers create tunnel barriers to current flow.

112 Claims, 16 Drawing Sheets

U.S. PATENT DOCUMENTS

| | | |
|---|---|---|
| 2004/0075464 A1 | 4/2004 | Samuelson et al. |
| 2005/0006673 A1 | 1/2005 | Samuelson et al. |
| 2005/0011431 A1 | 1/2005 | Samuelson et al. |
| 2005/0017171 A1 | 1/2005 | Samuelson et al. |
| 2006/0019470 A1 | 1/2006 | Seifert et al. |
| 2006/0125056 A1 | 6/2006 | Samuelson et al. |

OTHER PUBLICATIONS

Lao, J.Y., et al. "Hierarchical ZnO Nanostructures." Nanolett., vol. 2, No. 11 (2002): pp. 1287-1291.*

Wen, J.G., et al. "Self-Assembly of Semiconducting Oxide Nanowires, Nanorods, and Nanoribbons." Chem. Phys. Lett., vol. 372 (2003): pp. 717-722.*

Zhang, Y., et al. "Synthesis, Microstructure, and Growth Mechanism of Dendrite ZnO Nanowires." J. Phys. Chem. B, vol. 107 (2003): pp. 8289-8293.*

Zhu, Y.Q., et al. "Selective Co-Catalysed Growth of Novel MgO Fishbone Fractal Nanostructures." Chem. Phys. Lett., vol. 347 (Oct. 26, 2001): pp. 337-343.*

Dick et al., "Synthesis of branched 'nanotrees' by controlled seeding of multiple branching events," Nature Materials, Jun. 2004, vol. 3, pp. 380-384.

Gao et al., "Self-Assembled Nanowire-Nanoribbon Junction Arrays of ZnO," The Journal of Physical Chemistry B, Dec. 12, 2002, vol. 106, No. 49, pp. 12653-12658.

Grätzel, Michael, "Photoelectrochemical cells," Nature, Nov. 15, 2001, vol. 414, pp. 338-344.

Hiruma et al., "Quantum size microcrystals grown using organometallic vapor phase epitaxy," Appl. Phys. Lett., Jul. 22, 1991, vol. 59, No. 4, pp. 431-433.

Jun et al., "Architectural Control of Magnetic Semiconductor Nanocrystals," J. Am. Chem. Soc., 2002, vol. 124, No. 4, pp. 615-619.

Jun et al., "Controlled Synthesis of Multi-armed CdS Nanorod Architectures Using Monosurfactant System," J. Am. Chem. Soc., 2001, vol. 123, pp. 5150-5151.

Manna et al., "Synthesis of Soluble and Processable Rod-, Arrow-, Teardrop-, and Tetrapod-Shaped CdSe Nanocrystals," J. Am. Chem.. soc., 2000, vol. 122, pp. 12700-12706.

Manna et al., "Controlled growth of tetrapod-branched inorganic nanocrystals," Nature Materials, Jun. 2003, vol. 2, pp. 382-385.

O'Regan et al., "A low-cost, high-efficiency solar cell based on dye-sensitized colloidal $TiO_2$ films," Nature, Oct. 24, 1991, vol. 353, pp. 737-740.

Ozaki et al., "Silicon nanowhiskers grown on a hydrogen-terminated silicon {111} surface," Applied Physics Letters, Dec. 21, 1998, vol. 73, No. 25, pp. 3700-3702.

Poole et al., "Spatially controlled, nanoparticle-free growth of InP nanowires," Applied Physics Letters, Sep. 8, 2003, vol. 83, No. 10, pp. 2055-2057.

Shimada et al., "Size, position and direction control on GaAs and InAs nanowhisker growth," Superlattices and Microstructures, 1998, vol. 24, No. 6, pp. 453-458.

Wu et al., "Growth, branching, and kinking of molecular-beam epitaxial <110> GaAs nanowires," Applied Physics Letters, Oct. 20, 2003, vol. 83, No. 16, pp. 3368-3370.

Wang et al., "Rational Growth of Branched and Hyperbranched Nanowire Structures," Nano Letters, 2004, vol. 4, No. 5, pp. 871-874.

Wang et al., "Nanocrystals branch out," Nature Materials, Jun. 2003, vol. 2, pp. 355-356.

Xia et al., "One-Dimensional Nanostructuers: Synthesis, Characterization, and Applications," Adv. Mater., Mar. 4, 2003, vol. 15, No. 5, pp. 353-389.

Yan et al., "Dendritic Nanowire Ultraviolet Laser Array," J. Am. Chem. Soc., 2003, vol. 125, pp. 4728-4729.

Yan et al., "Morphogenesis of One-Dimensional ZnO Nano- and Microcrystals," Adv. Mater., Mar. 4, 2003, vol. 15, No. 5, pp. 402-405.

* cited by examiner

NANOSTRUCTURES FORMED OF BRANCHED NANOWHISKERS AND METHODS OF PRODUCING THE SAME

CROSS-REFERENCE TO RELATED APPLICATIONS

This application claims the benefit of the priority of U.S. Provisional Patent Application No. 60/524,890 filed Nov. 26, 2003, the entirety of which is incorporated herein by reference, and of U.S. Provisional Patent Application No. 60/560,701 filed Apr. 9, 2004, the entirety of which is incorporated herein by reference.

BACKGROUND OF THE INVENTION

1. Field of the Invention

This invention relates generally to methods of producing structures and devices by use of techniques of nanotechnology. More specifically, but not exclusively, the invention relates to methods of producing nanostructures incorporating at least one element, essentially in one-dimensional form, and that is of nanometer dimensions in its width or diameter. For the purposes of this application, such an element will be termed a "nanowhisker". The invention also relates to structures and devices incorporating nanowhiskers, preferably produced by the so-called Vapor-Liquid-Solid (VLS) mechanism.

2. Background Art

Nanotechnology techniques and processes may provide structures that range in size from small devices of atomic dimensions, to much larger scale structures for example, on the microscopic scale. Commonly, such structures include "nanostructures". In certain contexts nanostructures are considered to be those having at least two dimensions not greater than about 100 nm. Ordinarily, layered structures or stock materials having one or more layers with a thickness less than 1 μm are not considered to be nanostructures. Nanostructures include one-dimensional nanoelements, essentially in one-dimensional form, that are of nanometer dimensions in their width or diameter, and that are commonly known as nanowhiskers, nanorods, nanowires, nanotubes, etc.

The basic process of microscopic whisker formation on substrates, by the so-called VLS (vapor-liquid-solid) mechanism, is well known. A particle of a catalytic material, usually gold, for example, on a substrate is heated in the presence of certain gases to form a melt. A pillar forms under the melt, and the melt rises up on top of the pillar. The result is a whisker of a desired material with the solidified particle melt positioned on top. See E. I Givargizov, *Current Topics in Materials Science*, Vol. 1, pages 79-145, North Holland Publishing Company, 1978.) The dimensions of such whiskers were in the micrometer range.

International Application Publication No. WO 01/84238 discloses in FIGS. 15 and 16 a method of forming nanowhiskers, wherein nanometer sized particles from an aerosol are deposited on a substrate and these particles are used as seeds to create nanowhiskers, and other one-dimensional nanoelements.

Although the growth of nanowhiskers catalysed by the presence of a catalytic particle at the tip of the growing whisker has conventionally been referred to as the VLS (Vapor-Liquid-Solid) process, it has come to be recognized that the catalytic particle may not have to be in the liquid state to function as an effective catalyst for whisker growth. At least some evidence suggests that material for forming the whisker can reach the particle-whisker interface and contribute to the growing whisker even if the catalytic particle is at a temperature below its melting point and presumably in the solid state. Under such conditions, the growth material, e.g., atoms that are added to the tip of the whisker as it grows, may be able to diffuse through a the body of a solid catalytic particle or may even diffuse along the surface of the solid catalytic particle to the growing tip of the whisker at the growing temperature. Evidently, the overall effect is the same, i.e., elongation of the whisker catalysed by the catalytic particle, whatever the exact mechanism may be under particular circumstances of temperature, catalytic particle composition, intended composition of the whisker, or other conditions relevant to whisker growth. For purposes of this application, the term "VLS process", or "VLS mechanism", or equivalent terminology, is intended to include all such catalysed procedures wherein nanowhisker growth is catalysed by a particle, liquid or solid, in contact with the growing tip of the nanowhisker.

As previously noted, for the purposes of this application the term nanowhiskers is intended to mean one-dimensional nanoelements with a width or diameter (or, generally, a cross-dimension) of nanometer size. Preferably, although not necessarily, the elements are formed by the so-called VLS mechanism. Nanowhiskers are also referred to in the art as "nanowires" or, in context, simply as "wires", and such terminology, as used in this application, is equivalent to the term "nanowhiskers". In preferred practice of the invention, nanowhisker cross-dimensions typically do not exceed 50 nm and more preferably range about 20 nm or less. However, it is within the broader scope of the invention to utilize nanowhiskers having cross-dimensions greater than 50 nm, say up to 100 nm, or even 500 nm or more. Of course, larger nanowhisker cross-dimensions will generally result in larger structures and may therefore be less desirable in many applications.

Several experimental studies on the growth of nanowhiskers have been made. Hiruma et al. grew III-V nanowhiskers on III-V substrates in a metal organic chemical vapor deposition (MOCVD) growth system. See K. Hiruma, et al., *J. Appl. Phys.* 74, page 3162 (1993); K. Hiruma, et al., *J. Appl. Phys.* 77, page 447 (1995); K. Hiruma, et al., *IEICE Trans. Electron.* E77C, page 1420 (1994); K. Hiruma, et al., *J. Crystal Growth* 163, pages 226-231 (1996).

In prior U.S. patent application Ser. No. 10/613,071, published as No. 2004-0075464, to Samuelson et al., and International Patent Application Publication No. WO-A-04/004927, both of which publications and their underlying applications are incorporated herein by reference, there are disclosed methods of forming nanowhiskers by a chemical beam epitaxy method. Nanowhiskers are disclosed having segments of different materials, with abrupt or sharp heterojunctions therebetween. Various nanostructures of controlled size and formation are disclosed. Such nanostructures serve as components in the formation of novel structures, as disclosed.

Gao et al., "Self-assembled Nanowire—Nanoribbon Junction Arrays of ZnO", *J. Phys. Chem. B*, vol. 106(49), pages 12653-12658 discloses nanostructures comprising branched structures of ZnO, formed by a VLS process.

Nanocrystals have been synthesised with a wide variety of shapes. Synthesis of tetrapod-shaped structures of controlled size as integral structures by precipitation from solutions is disclosed in Manna et al., "Synthesis of soluble and processable rod-, arrow-, teardrop-, and tetrapod-shaped CdSe nanocrystals", *J. Am. Chem. Soc.* 122, pages 12700-12706 (2000).

As regards structures formed of large numbers of nanostructures, solar cells (so-called Grätzel cells) are known comprising optically transparent films of $TiO_2$ particles coated with monolayers of a charge transfer dye. See O'Regan et al., "A low-cost, high-efficiency solar cell based on dye-sensitive colloidal $TiO_2$ films", *Nature* 353, pages 737-740 (1991).

Much research has been carried out into neural networks (neuromorphic electronics) since the pioneering work of Carver Mead with VLSI systems. For a recent report, see, for example, Cohen et al., Report on the 2003 Workshop on Neuromorphic Engineering, Telluride, Colo., Jun. 29-Jul. 19, 2003. However, techniques of nanotechnology have not generally been applied in this area.

SUMMARY OF THE INVENTION

The present invention provides, in one of its main aspects, a nanostructure having a novel tree-like construction formed of nanowhiskers, and methods of producing such a nanostructure. Generally, the tree-like structure includes a base nanowhisker, which may be analogized to the trunk of a tree, and one or more nanowhiskers grown outwardly from a peripheral surface of the base nanowhisker and analogous to branches of a tree. Additional nanowhisker "branches" may be grown upon the periphery of one or more previously grown nanowhisker branches, yielding more complex "tree" structures. The base nanowhisker may be formed in any desired manner, but is preferably grown on a substrate by the VLS mechanism so as to be upstanding from the substrate. Branch nanowhiskers are also preferably formed by the VLS mechanism, at intermediate points along the length of the base nanowhisker or, in the case of a nanowhisker grown on a previously grown branch, at an intermediate point along the length the previously grown branch. Constituent materials and growth parameters of the nanowhiskers may be controlled so as to achieve structures having desired form and characteristics. Self-assembly techniques may advantageously be used to form novel structures and devices incorporating large numbers of tree-like nanostructures.

A principal concept of the invention thus relates to the formation of a nanostructure from nanowhiskers in a series of stages. In a first stage, first catalytic particles are provided on a substrate (for example, as an array of particles), and first nanowhiskers (which may be referred to as first level nanowhiskers herein) are grown from the catalytic particles so as to be upstanding from the substrate, by the VLS process, involving exposing the substrate to appropriate conditions, such as temperature, precursor, etc. In a second stage, second catalytic particles are deposited on the sides of the upstanding nanowhiskers. Conveniently, this is carried out by aerosol deposition of catalytic particles. In a second VLS process, second nanowhiskers (which may be referred to herein as second level nanowhiskers) are formed from the second catalytic particles, and these extend transversely from the sides of the nanowhiskers, resembling branches of trees. The invention thus provides a method for controlled step-wise growth of branched semiconducting nanowire structures, analogous to tree structures. The method utilises nanowires grown epitaxially, catalysed by nanoparticles. Levels of nanowhisker "branches" can be grown sequentially, making the complexity of such structures theoretically limitless, where each set of nanowhisker branches can be given different length, diameter, and chemical composition, or even variation in chemical composition, as desired. Thus, the present invention provides much greater flexibility in the variety of nanostructures that can be created, as compared to the nanostructures produced by the known "single stage" processes referred to above. It will be appreciated that although the growth of pluralities of first level and second level nanowhiskers is contemplated, the two stage process just described may use but a single nanoparticle in the first stage so as to grow a single nanowhisker trunk, with one or more branch nanowhiskers being grown form the trunk in the second stage. Furthermore, it will be appreciated that, in practice, nanowhisker growth may not occur via every catalytic particle deposited on a surface. Thus, in the context of the present application, references to specified catalytic particles, such as first catalytic particles, second catalytic particles, further catalytic particles, and like references, are intended to include those catalytic particles at which nanowhisker growth actually occurs.

In a first aspect, the invention provides a method of forming a nanostructure, comprising growing a first nanowhisker, preferably on a substrate, and growing a second nanowhisker from a periphery of the first nanowhisker such that the second nanowhisker extends transversely to the first nanowhisker.

According to one preferred mode, the invention provides a method of forming a nanostructure, comprising:

a first stage which includes providing at least one first catalytic particle on a substrate and growing a respective first nanowhisker by the VLS process via each said first catalytic particle; and a second stage which includes providing on the periphery of at least one said first nanowhisker, at least one second catalytic particle, and growing by the VLS process, from each said second catalytic particle, a second nanowhisker extending transversely from the periphery of the respective first nanowhisker.

In a second aspect, the invention provides a nanostructure comprising a first nanowhisker on a substrate, and at least one second nanowhisker grown from the periphery of the first nanowhisker and extending transversely to the first nanowhisker. The first nanowhisker is preferably grown from the substrate so as to be upstanding therefrom.

In the ensuing discussion, said second nanowhiskers may be referred to as "branch nanowhiskers", and said first nanowhiskers as "trunk" or "stem" nanowhiskers. Third, and if desired, one or more subsequent stages may be carried out, similar to the second stage, whereby in each successive stage further nanowhiskers (analogous to "twigs" or "leaves") may be grown laterally from the sides of the nanowhiskers formed in the immediately preceding stage.

In said first stage of nanowhisker growth, the catalytic particles may be formed on the substrate in any suitable way, as by aerosol deposition, electron beam writing, or nanoimprint lithography, for example. Where a precisely positioned array of nanowhiskers is required, there may be employed the techniques disclosed and claimed in copending U.S. patent application Ser. No. 10/751,944, to Samuelson et al., filed Jan. 7, 2004, the contents of which are herein incorporated by reference.

Any suitable method may be employed to form nanowhiskers by the VLS process from the catalytic particles. MOVPE (MOCVD), and CBE processes are currently preferred, as have been previously proposed and demonstrated, as in prior U.S. patent application Ser. No. 10/613,071, published as No. 2004-0075464, to Samuelson et al., and International Patent Application Publication No. WO-A-04/004927, both of which publications and their underlying applications are incorporated herein by reference.

Aerosol deposition of nanoparticles offers advantages in this invention, since the nanoparticles are easily deposited onto complex structures and are known to highly accurately govern the diameter of the nanowires for which they are the seeds. Their density may be very accurately controlled, so that the number of nanowhisker branches created on an existing nanowhisker may be accurately controlled. Further, the orientation of the nanowhisker branches is accurately determined, in that they may only have a limited number of orientations relative to the nanowhiskers on which they are grown, as explained in more detail below. Further control may be exercised over the spacing of the nanowhiskers branches along the length of the nanowhiskers on which they are grown. Such control is essentially on a statistical or average basis, rather than a one-to-one positioning technique.

It has been found that by application of electric voltages to the substrate, electric fields created around the nanowhiskers greatly assist in electrostatic precipitation of the nanoparticles on to the existing grown nanowhiskers. Thus said second catalytic particles are preferentially deposited on the sides of the first nanowhiskers, as opposed to the substrate. Although there may be some deposition randomly on the substrate, the high electric fields created around the nanowhiskers will cause preferential deposition on the nanowhiskers. More generally, the $n^{th}$ catalytic particle deposition (n being a positive integer greater than or equal to 2) is preferentially deposited on the $(n-1)^{th}$ growth of nanowhiskers, although some deposition on the $(n-2)^{th}$ growth, etc., may also occur for a third or subsequent particle deposition. Further, it has been found that the catalytic particles are evenly distributed circumferentially of the existing nanowhiskers and along the length of the nanowhiskers by appropriate control of the aerosol deposition.

Whilst aerosol deposition is preferred, it is in principle possible to employ other means of locating catalytic particles on the side of a nanowhisker. For example, if more accurate location is required, a catalytic particle may be positioned by means of an atomic force microscope, manually or by an automatic location technique.

As regards the orientation of the nanowhiskers relative to the substrate, it is usually convenient for the first level nanowhiskers to extend upright perpendicular to the surface of the substrate. Commonly, with III-V semiconductor materials, this is achieved by using the (111) substrate surface so that the first level nanowhiskers extend in the <111> direction. However, if desired, other substrate surfaces may be used that may imply that the first level nanowhiskers extend at an inclined angle to the substrate surface. By careful control of the catalytic growth process, desired orientations may be achieved relative to a variety of substrate surfaces. See copending U.S. patent application Ser. No. 60/541,949, filed Feb. 6, 2004, to Seifert et al., the contents of which are herein incorporated by reference. In that application, it is disclosed that nanowhiskers can be grown in a desired crystal plane of the nanowhisker material provided that other preferential growth directions are not activated during the initial stages of growth.

Further, the material of the substrate may be different from that of the first level nanowhiskers. See copending U.S. Patent Application No. 60/582,313, filed Jun. 25, 2004, to Samuelson et al., the contents of which are herein incorporated by reference. That application discloses the provision of a perfect, atomically flat, growth surface to promote growth of nanowhiskers from a surface of a dissimilar material.

The second level nanowhiskers may be formed of a different material from that of the first level nanowhiskers, or, more generally, the $n^{th}$ level nanowhiskers may be formed of a different material from that of the $(n-1)^{th}$ level nanowhiskers. This may provide a heterojunction at the growth point of each nanowhisker, but if a precisely formed heterojunction is required, then growth conditions are preferably changed during growth of a nanowhisker by rapidly substituting a different gaseous growth material, to form a heterojunction along the length of the nanowhisker, in accordance with the teachings of prior U.S. patent application Ser. No. 10/613,071, published as No. 2004-0075464, to Samuelson et al., and International Patent Application Publication No. WO-A-04/004927, both of which publications and their underlying applications are incorporated herein by reference. Examples of the use of such heterojunctions are given in specific examples hereinafter described.

As regards the orientations of the second level nanowhiskers extending from the sides of the first level nanowhiskers, these will be determined largely by the crystal facets of the first level nanowhisker. Thus for a <111> directed first level nanowhisker, this has six facets along its length, and there are three principal growth directions at 120 degrees to one another in the <111>B direction; this implies that the second level nanowhiskers will also slope downwardly. This further implies that all the second level nanowhiskers on all the first level nanowhiskers will extend in these same three directions. However, as disclosed below, where the crystal structure of a nanowhisker changes along its length from Zinc Blende to Wurtzite, as may commonly occur, there may be three further directions of nanowhisker growth, rotated at 60 degrees relative to the first set.

For other directions of first level nanowhisker, the second level nanowhiskers may extend in different directions. For example, if the first level nanowhisker has an <001> direction, the first level nanowhisker may have a rectangular cross section, and there will be four growth directions of the second level nanowhiskers, one from each facet. Since, in the most common case, these directions are <111> directions, two growth directions will be pointing upwards, and two downwards, but at right angles to one another in plan.

Whereas the invention is primarily concerned with nanowhiskers, it is possible that in certain circumstances, the growth of other forms of one-dimensional nanoelements, e.g., multi-walled nanotubes, may take the place of one or more of the nanowhisker growth stages.

The present invention therefore provides, in a more general aspect, a method of forming a nanostructure, comprising growing a first one-dimensional nanoelement, preferably on a substrate, and growing a second one-dimensional nanoelement from a periphery of the first one-dimensional nanoelement such that the second one-dimensional nanoelement extends transversely to the first one-dimensional nanoelement.

In a preferred mode, the invention provides a method of forming a nanostructure, comprising:

a first stage which includes providing at least one first catalytic particle on a substrate, and forming a respective first one-dimensional nanoelement via each said first catalytic particle; and a second stage which includes providing on the periphery of at least one said first one-dimensional nanoelement, at least one second catalytic particle, and forming from each said second catalytic particle, a second one-dimensional nanoelement extending transversely from the periphery of the respective first one-dimensional nanoelement.

In a further aspect, the present invention provides a structure comprising a substrate, and one or more nanostructures formed on the substrate, each nanostucture comprising a first one-dimensional nanoelement upstanding from the substrate, and having at least one second one-dimensional nanoelement grown and extending transversely from its periphery.

In still another aspect, the present invention provides a nanostructure comprising a first one-dimensional nanoelement, a second one-dimensional nanoelement grown on and extending transversely from a periphery of the first one-dimensional nanoelement, and a third one-dimensional nanoelement grown on and extending transversely from a periphery of the second one-dimensional nanoelement. The first nanoelement is preferably grown from a substrate so as to be upstanding therefrom.

In yet another aspect, the present invention provides a structure comprising a substrate and a plurality of nanostructures disposed on the substrate, each nanostructure including a respective first one-dimensional nanoelement grown on the substrate, and at least one nanostructure having a portion that contacts another nanostructure, wherein the portion of the one nanostructure includes a second one-dimensional nanoelement grown on and extending transversely from a periphery of the first one-dimensional nanoelement of the one nanostructure.

In one specific application of structures formed from nanostructures according to the invention, a solar cell array is constructed, wherein at least some of said catalytic particles are employed as electrical contacts for applying a voltage between the free ends of the nanowhiskers and the substrate, permitting photoelectrons, released within the nanowhiskers by photon capture, to be swept away as electrical current. Junctions and heterojunctions between dissimilar materials created within and between nanowhiskers form convenient photodetector regions. Further the use of regions of dissimilar materials may permit the solar cell array to be sensitive to a variety of different wavelength regions, and thus make it more efficient.

Such a construction may require electrical isolation of the peripheries of the nanowhiskers from a surrounding conducting material (e.g., a conducting polymer) that is used to make contact with the catalytic particles at the ends of the nanowhiskers. In an exemplary embodiment, such electrical isolation may be created by forming an outer cylindrical shell of insulating material around each nanowhisker. Conveniently, this is done by switching conditions during a MOVPE growth operation of for example GaP, such as to cause bulk growth of a material such as AlP as a coaxial shell around each nanowhisker. Subsequently, an oxidation operation converts the outer shell of AlP to $Al_2O_3$ (transparent sapphire).

In a further application, a light-emitting panel is created by providing a structure generally similar to the solar cell array above, but wherein each second level and/or third level, etc. nanowhisker has grown therein a segment of optically active material that forms heterojunctions with the adjacent portions of the nanowhisker, to create Light Emitting Diodes. Additionally, or alternatively, Light Emitting Diodes may similarly be incorporated into the first level nanowhiskers, if desired. Application of a voltage between the substrate and the catalytic particles at the ends of the nanowhiskers energises the LEDs to create an overall homogeneous light emitting area. Alternatively, the structure can be divided up into pixels or regions that are separately energisable to create an addressable display.

In another application of a structure formed from nanostructures of the invention, a neural network is created. For example, first level nanowhiskers can be positioned closely together on the substrate, and branch (e.g., second) nanowhiskers can be formed sufficiently long and in a sufficient density that, on average, electrical contact is made between (i) a controlled number of branch nanowhiskers associated with each first level nanowhisker and (ii) trunk and/or branch nanowhiskers associated with neighbouring nanotrees. Heterojunctions may be formed within branch nanowhiskers, by the techniques discussed above, to form tunnel barriers therein, allowing the branch nanowhiskers to function in a manner analogous to synapses, by build up of charge within the tunnel barrier, that is eventually released or fired across the barrier. Similarly, such heterojunctions may be formed in trunk nanowhiskers.

BRIEF DESCRIPTION OF THE DRAWINGS

The aforementioned and other concepts, aspects, and applications of the invention will be more fully appreciated in view of the following description of preferred embodiments of the invention taken in conjunction with the accompanying drawings, described briefly below.

FIG. 1A shows an array of nanostructures comprising branched nanowhiskers formed by aerosol deposition of catalytic particles, followed by MOVPE growth, viewed 30° from above. FIG. 1B shows a modification of the example with a lithographically defined array of nanostructures or nanotrees, viewed 45° from above. FIG. 1C shows 3 branch directions, from above. FIG. 1D shows 6 branch directions, from above.

FIG. 2A shows an image of a trunk exhibiting five branches, with three different growth directions visible. An arrow marks the position of FIG. 2B. Some broken off branches are also visible in the figure; note that these branches are easily broken off during transfer to the TEM grid. FIG. 2B shows the branch-trunk interface (indicated by arrows) at higher magnification. The horizontal bands of alternating wurtzite or sphalerite structure continue smoothly out into the branch, with no apparent interface region in the crystal. FIG. 2C shows an image of 3-level growth showing the trunk (X), first branch (Y), and second branch (twig) (Z).

FIG. 3A shows the number of particles and branches per tree as a function of particle deposition density. FIG. 3B shows length of branches as a function of number of branches per tree. This dependence is attributed to the role of Ga diffusion in branch growth.

FIG. 4A shows a TEM dark-field image with EDX linescan data of one branch. Note the sharp increase in As/decrease in P at the first interface. FIG. 4B shows photoluminescence data of six individual nanotrees containing heterostructures.

FIG. 7A shows an image of two nanowhisker trunks interconnected by a pair of nanowhisker branches, viewed from above. Each interconnecting branch is grown to a sufficient length as to make electrical contact, through its associated catalytic particle, to the adjacent trunk. FIG. 7B shows the same viewed 30° from above.

DESCRIPTION OF THE PREFERRED EMBODIMENTS

Figure 1A:
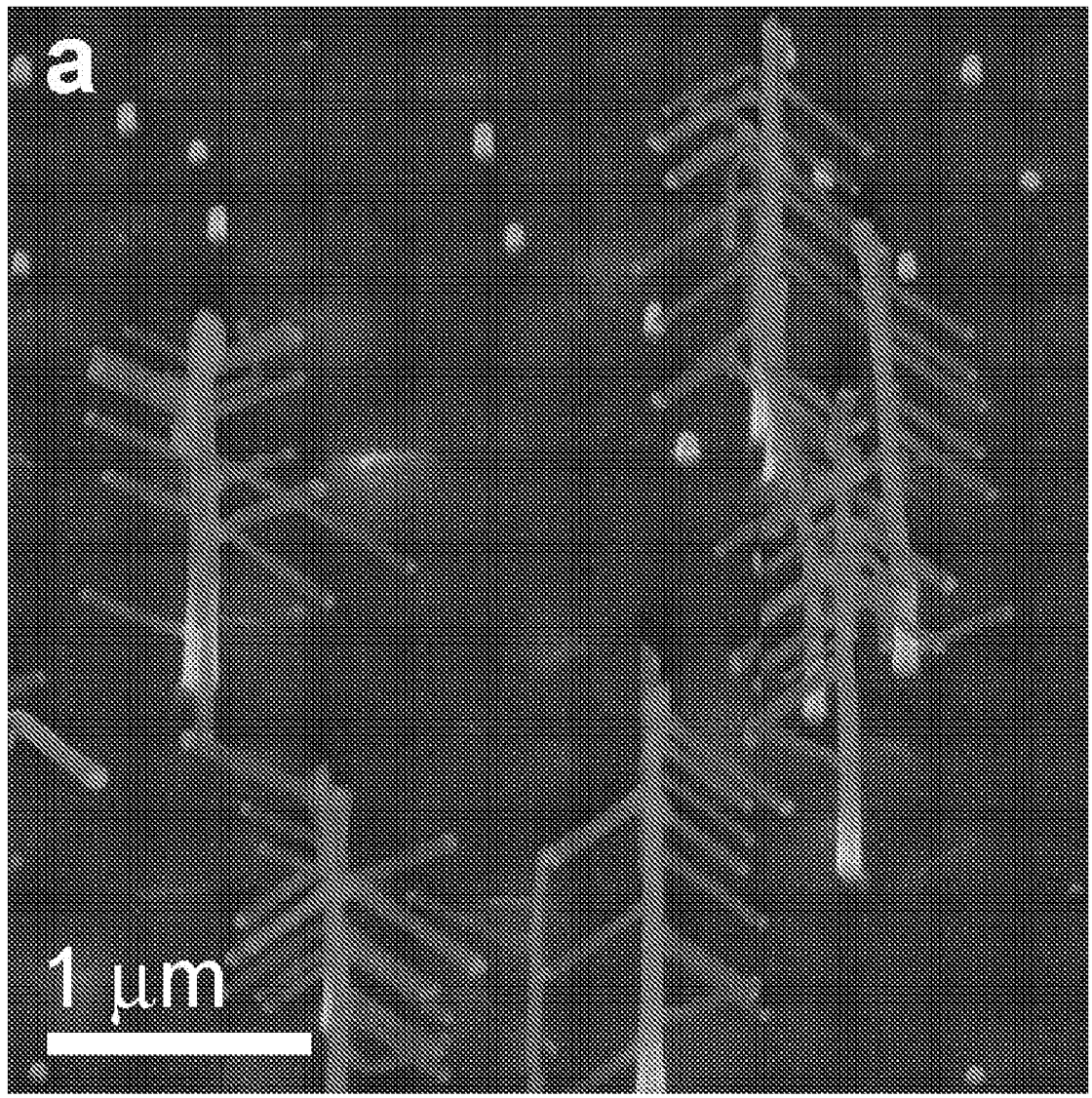
FIGS. 1A to 1D comprise SEM images of GaP nanostructures formed according to a first example of the invention.

In the following, it is shown how self-assembled growth of semiconductor nanowires via the vapor-liquid-solid (VLS) growth mode, may allow tree-like nanostructures to be formed in a highly controlled way. This bottom-up method preferably uses initial seeding by catalytic nanoparticles to form the trunk, followed by the sequential seeding of branching structures. Each level of branching is controlled in terms of branch length, diameter, and number, as well as chemical composition. It is shown, by high-resolution transmission electron microscopy, that the branching mechanism gives highly ideal continuous crystalline (monolithic) structures throughout extended and complex tree-like structures.

A method has been developed for controlled step-wise growth of branched semiconducting nanowire structures resembling trees. This method utilises nanowires grown epitaxially, catalysed by gold aerosol nanoparticles. Levels of "branches" are grown sequentially, making the complexity of such structures theoretically limitless, where each set of branches can be given different length, diameter, and chemical composition, thus allowing a degree of control and flexibility not previously seen. Aerosol nanoparticles offer great advantage in this case, since they are easily deposited onto complex structures and are known to highly accurately govern the diameter of the nanowires for which they are the seeds.

EXAMPLE

Growth of nanostructures comprising branched nanotrees was performed in two steps. The first was the growth of vertical GaP nanowires to serve as "trunks." These were grown by the vapor-liquid-solid (VLS) mechanism. Gold seed particles were deposited on GaP (111)B substrate (~10 mm$^2$) by aerosol deposition, at a density of 0.5 particles per square micron of substrate. To achieve this, gold was evaporated in a high temperature (1850° C.) furnace, then passed through a charger to obtain a uniform charge distribution. Then, electrical mobility can be directly associated with size, and so particles are size-selected using a differential mobility analyser (DMA). Next, particles were re-heated (600° C.) to sinter (within the aerosol system), resulting in a compact, spherical shape, then size-selected a second time. As the selected particles thus have a uniform size and are singly charged, the total particle concentration can be determined by measuring the current from particles impinging on an electrometer.

Nanoparticles were deposited on the substrate by electrostatic precipitation, at a field strength of 300 kV/m. This device consists of a cylindrical chamber where a uniform electric field is applied between an upper plate and a lower plate, on which the substrate is placed (see International Patent Application Publication No. WO 01/84238, the contents of which are incorporated herein by reference). Particles produced in the aerosol apparatus flow between these plates when no field is applied. When the field is applied, the charged particles are driven towards the substrate surface, resulting in random but homogeneous distribution over the substrate. Since particle concentration in the aerosol flow is constant, the total number of deposited particles (per unit area of substrate) is a function of the time for which the electric field is applied. Distribution of these particles can be accurately predicted as a function of the interplay between Brownian and electrostatic forces on the particles. For a detailed analysis, see Krinke, et al; "Microscopic aspects of the deposition of nanoparticles from the gas phase", *Journal of Aerosol Science* 33 (10), pages 1341-1359 (October 2002).

Nanowhiskers were subsequently grown from these seeds by metal-organic vapor phase epitaxy (MOVPE). Particle sizes of 40-70 nm were used to seed these "trunks"; deposition densities of 0.5-2 particles per square micron were used. Length of nanowhiskers is a function of growth time; growth time of 4 minutes was used for all trunks (length ~2 μm). In this work GaP nanowhiskers were grown on GaP substrates at temperatures of 400, 430, 460, 490 and 520° C.; pressure was kept constant at 10 kPa. Trimethylgallium (TMG) was supplied to the reactor during growth time, with molar fraction χ (TMG) varied from 0.6-2.5×10$^{-5}$. A constant flow of phosphine (PH$_3$) was maintained, with molar fraction χ(PH$_3$) of 7.5×10$^{-3}$. For growth of InP trunks on InP substrates, trimethylindium was the source material, with a molar fraction χ (TMI)=1.5×10$^{-6}$, growth temperature of 400° C. and pressure of 10 kPa. For heterostructures, arsine (AsH$_3$) was introduced; χ(AsH$_3$)=2.3×10$^{-4}$. Nanowhiskers grow upwards at a constant rate, in the <111>B direction, with hexagonal cross-section; [001] nanowires have a square cross-section.

The next step was to grow smaller nanowire "branches" on the trunks. Smaller aerosol particles (10, 15, 20, 30 and 40 nm diameter) were deposited on the trunks by placing the sample back into the aerosol particle deposition chamber. Deposition densities were varied from 1-25 particles per square micron of substrate (shown to be directly related to particles deposited on trunks, FIG. 3A). Smaller nanowire "branches" were subsequently grown on the trunks from the new seed particles. In particular, GaP branches were produced on GaP trunks, and InP branches were produced on InP trunks. The length of these branches was a function of growth time, reagent concentrations and growth temperature; these relationships were calibrated in this experiment. It will be appreciated that, by appropriate selection of precursors and other growth conditions, the branch nanowhiskers of a given level may differ in composition from the nanowhiskers of the preceding level in their total length or in shorter segments.

To demonstrate the versatility of this approach, a third set of gold seed particles (10, 15, 20 nm diameter) was deposited onto the branches of several samples. A third level of branches was subsequently grown, again using GaP and InP (by methods described above). Deposition densities of 5-15 particles per square micron of substrate and growth times of 10-20 seconds were used.

Samples were characterised by scanning electron microscopy (SEM) and by transmission electron microscopy (TEM). For the high-resolution TEM images, a 300 kV transmission electron microscope was used, with a point resolution of 0.162 nm, and equipped with a field emission gun. Chemical analyses was performed with an energy-dispersive x-ray spectrometer, normally in STEM mode, giving a probe size <1 nm. The phase contrast images were recorded digitally with a 2 k×2 k CCD camera. Samples were prepared for TEM analysis by mechanically rubbing the surface of the substrate against a TEM grid, causing trees to break off onto the grid. For this reason, many trees exhibit one or more broken branches in the TEM images.

Figure 1B:
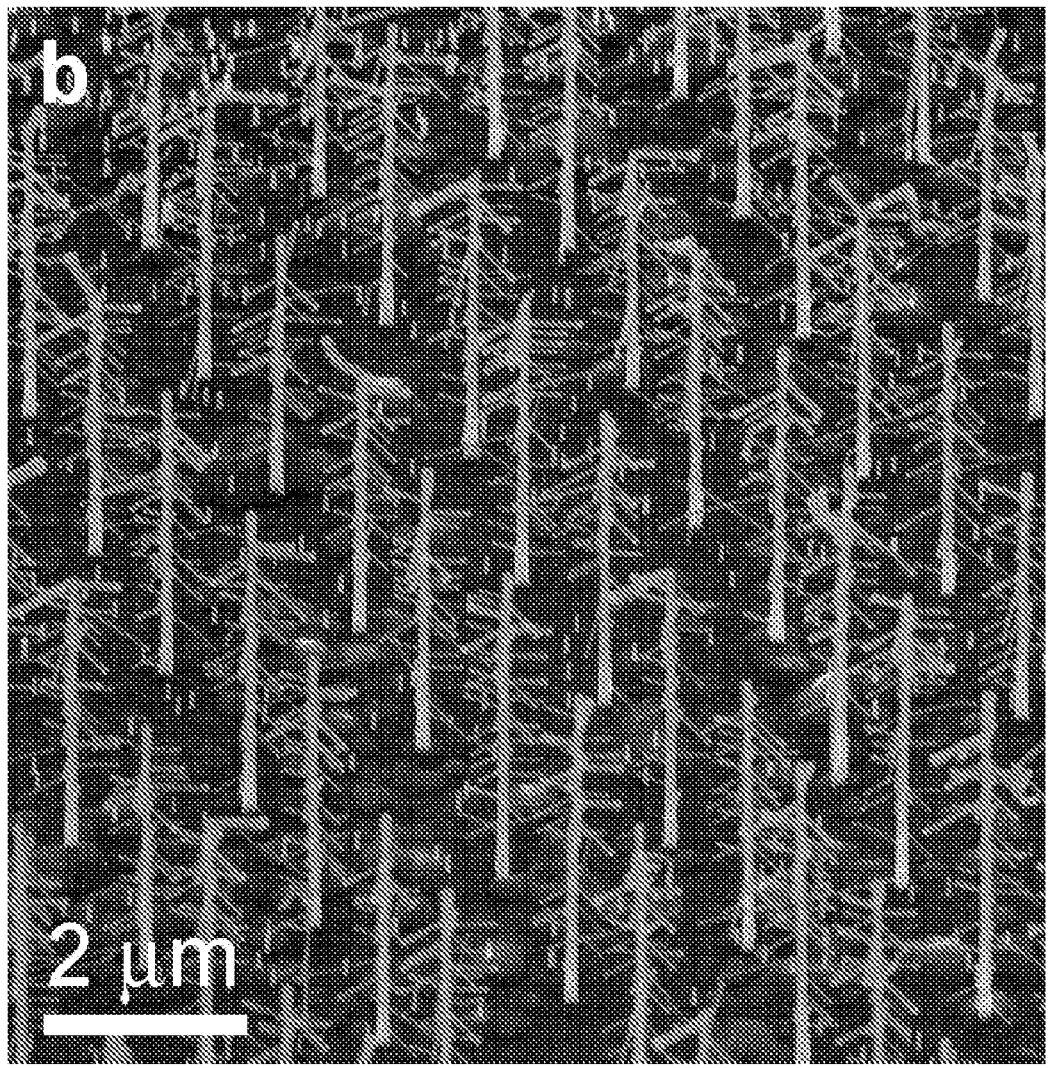
Figure 1C:
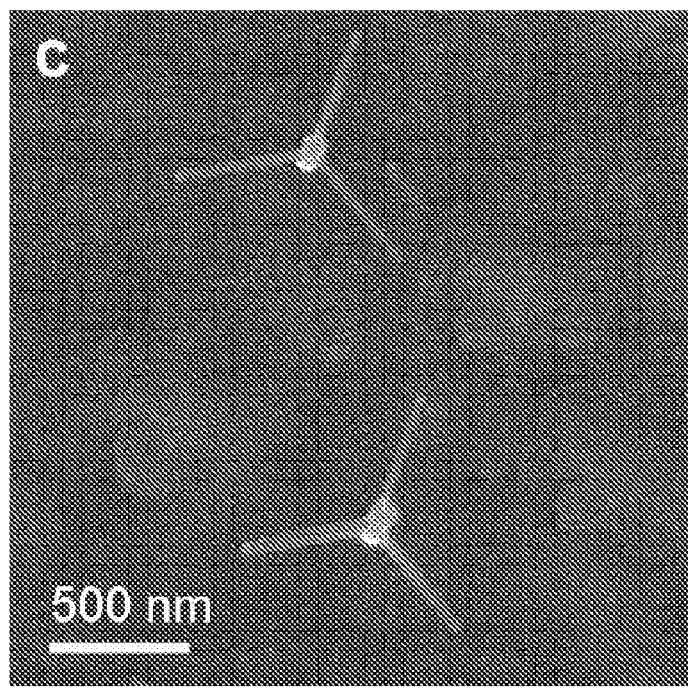
Figure 1D:
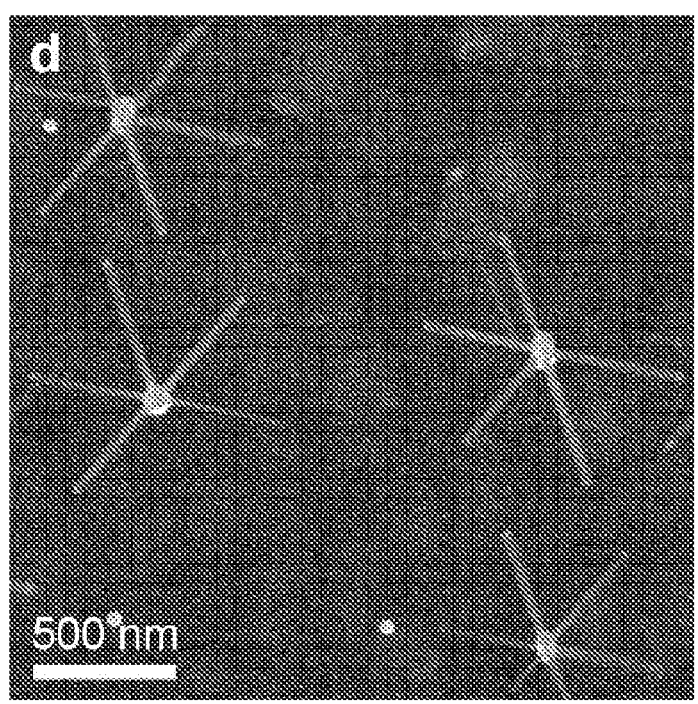
Figure 2A:
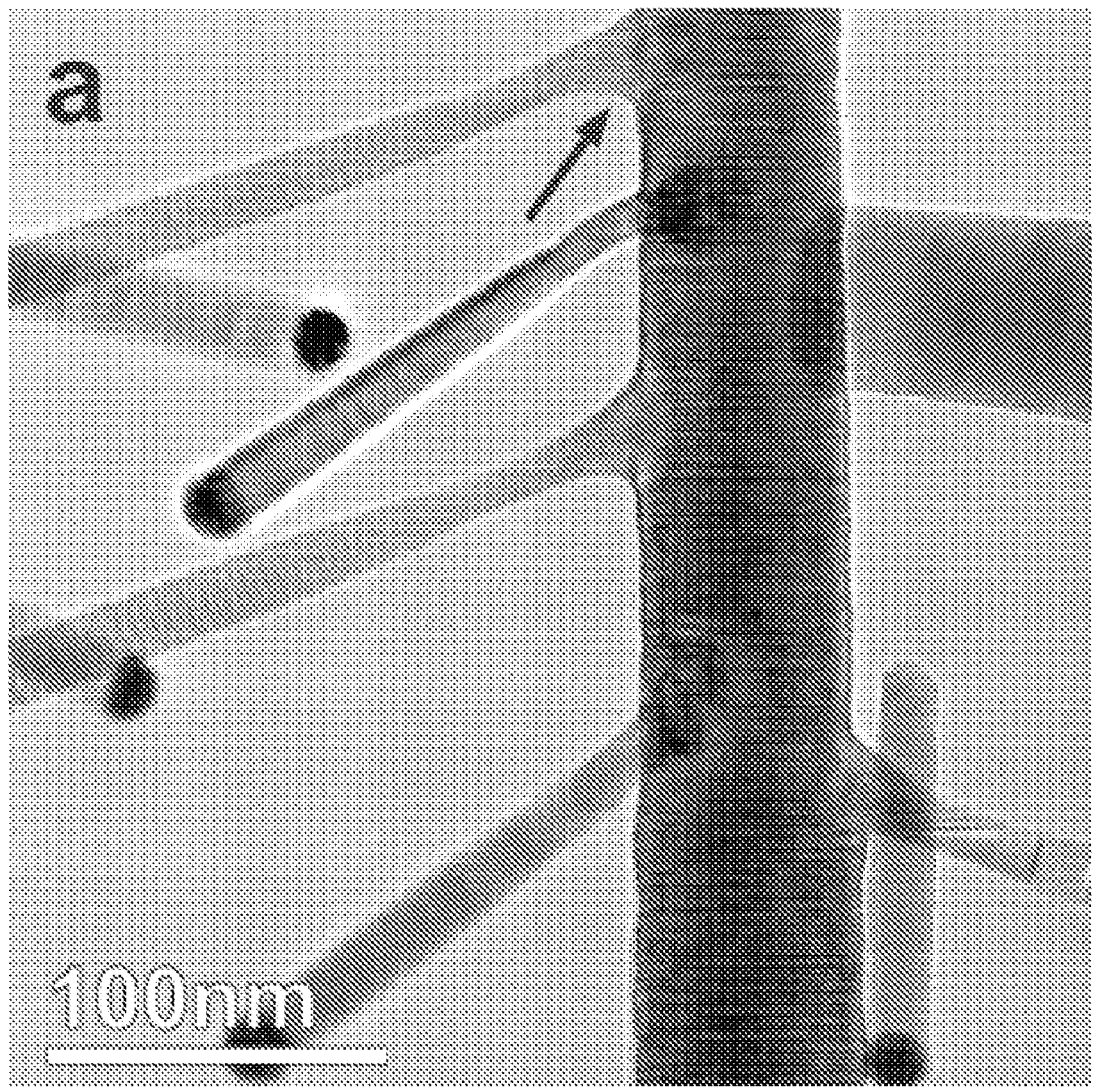
FIG. 2A to 2C comprise TEM images of GaP nanostructures of FIG. 1.

Branched gallium phosphide (GaP) nanostructures or "nanotrees" were grown on GaP (111)B substrates (FIGS. 1, 2). First, nanowire "trunks" were grown by the VLS growth method in the <111>B direction, using metal-organic vapour phase epitaxy (MOVPE). Next, aerosol seed particles were deposited along these "trunks" and a second growth phase initiated, resulting in clearly defined "branches." Branches grew downwards in the other three <111>B directions. FIG. 1A shows an image of a "nanoforest" with each tree having this trunk-branch structure. The "forest" was grown in MOVPE, at 460° C., with 8.9 branches per tree on average. These structures are highly stable, exhibiting no morphological changes over several months when stored in air. It should also be noted that there is no variance in tree morphology across the entire substrate.

In addition to randomly distributed trees, ordered arrays of nanotrees have been grown (FIG. 1B), according to the techniques described in in copending U.S. patent application Ser. No. 10/751,944, to Samuelson et al., filed Jan. 7, 2004, the contents of which are herein incorporated by reference. Trunk nanowires were seeded by arrays of gold particles produced by electron-beam lithography. After this seeding, growth of the nanotrees proceeded as for those of random distribution, previously discussed.

Figure 2B:
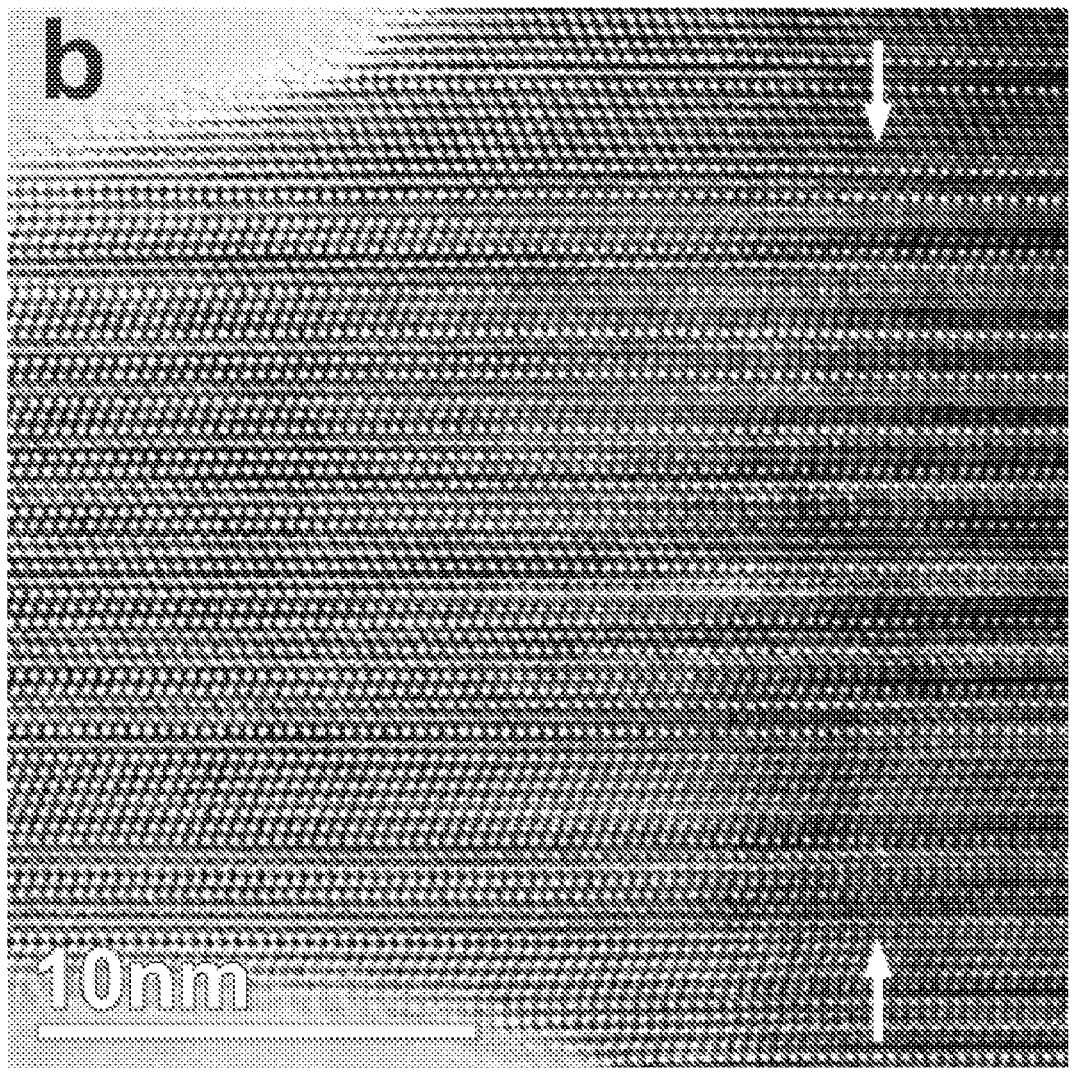

Viewed from above, the trees of FIG. 1A or 1B exhibit three branch directions separated by 120° (FIG. 1C), with each branch nanowhisker extending in one of these three directions; this is a result of the alignment of the crystal planes in the trunk nanowhiskers, and the requirement for the second level nanowhiskers to preferentially grow in the <111> direction from the crystal facets at the sides of the trunk nanowhiskers. In FIG. 1C, there are 5.6 branches per tree on average. This symmetry is typically observed for samples with fewer than 7 branches per tree. However, stacking faults in the trunk can result in short sections rotated 60° from the primary growth direction as viewed from above (FIG. 1D). High resolution TEM images show clearly the numerous stacking faults within the trunk nanowires (FIG. 2B), giving a mixed sphalerite (cubic) and wurtzite (hexagonal) structure. This behaviour is well known and is due to the small energy difference between stacking sequences in this growth direction. The growth directions of the trunk and branches are seen to be symmetry-related <111>B directions in the cubic cell, with the stacking faults always perpendicular to the growth direction of the nanowire (FIG. 2B).

Branches that nucleate from rotated segments will grow downwards, exactly 60° from the primary branches when viewed from above. Since branches nucleate from gold aerosol particles randomly deposited on the trunk, nucleation from rotated sections is possible but somewhat less likely than nucleation in the primary directions. It has been found that for low densities of seed particles (and thus branches), few branches grow on the rotated segments. For higher densities, branches can grow in all three rotated directions, and trees typically exhibit up to 6 branch directions, separated by 60°, when viewed from above. This is shown in FIG. 1D, with 10 branches per tree. This symmetry was consistently observed for samples with more than 10 branches per tree; for samples with more than 12 branches per tree, all trees showed 6 branch directions.

Growth of epitaxial nanowires in directions other than <111>B has been disclosed in copending U.S. patent application Ser. No. 60/541,949, to Seifert et al., the contents of which are incorporated herein by reference. Use of such nanowires as trunks would allow for variation of the directionality of the branches. InP branches on InP [001] trunks have also been grown in accordance with the invention. Under the same growth conditions as other branches in this study, such branches grow in the preferential <111>B directions, resulting in four branch directions separated by 90° in the XY plane.

Figure 3A:
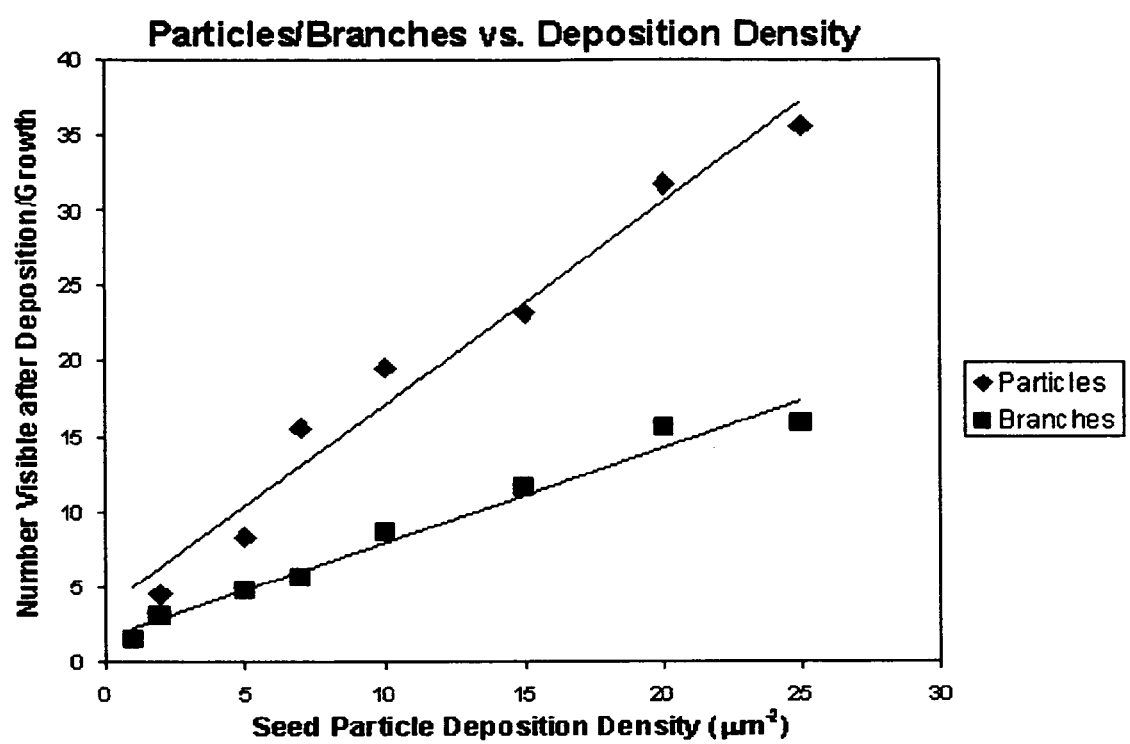
FIGS. 3A and 3B comprise graphs indicating the control of morphology or shape of the structures of FIG. 1 by deposition of seed particles.

The number of particles deposited per square micron of substrate is controlled (in a statistical sense) during deposition. This directly determines the number of particles deposited per tree, and the number of branches grown. This relationship is linear in the region studied (FIG. 3A). Note about half of particles are found to seed branches; trunks have six facets, but only three symmetry-related <111>B directions are possible for a given crystal structure. The number of branches per tree varies by ±10% for a given deposition density, over the entire substrate of ~10 mm² area. It is expected that the number of particles deposited will become essentially constant (independent of deposition density) for very high densities, due to the finite surface area per tree. Diameters of both trunk and branches are accurately determined by the diameters of the respective seed particles. Branch diameter has no significant effect on the morphology of the trees in this size region. Branch length can be controlled by growth time, growth temperature, and reagent concentrations, for a given branch density. The relationship between each of these parameters and the resulting branch morphology has been calibrated; length and diameter of branches are controlled to within ±5%.

Gallium is the limiting reagent in the growth of GaP nanowires. It is believed that branch growth proceeds via two pathways: first, by direct incorporation of Ga into the seed particle from the vapor (and subsequent formation of GaP), and second, by diffusion of Ga along the substrate, trunk, and branches to be incorporated into the particle. The first is independent of number of branches; growth rate is determined only by the mass transport. By this route, branches grow a constant volume as a function of time; and branch length is independent of number of branches.

Figure 3B:
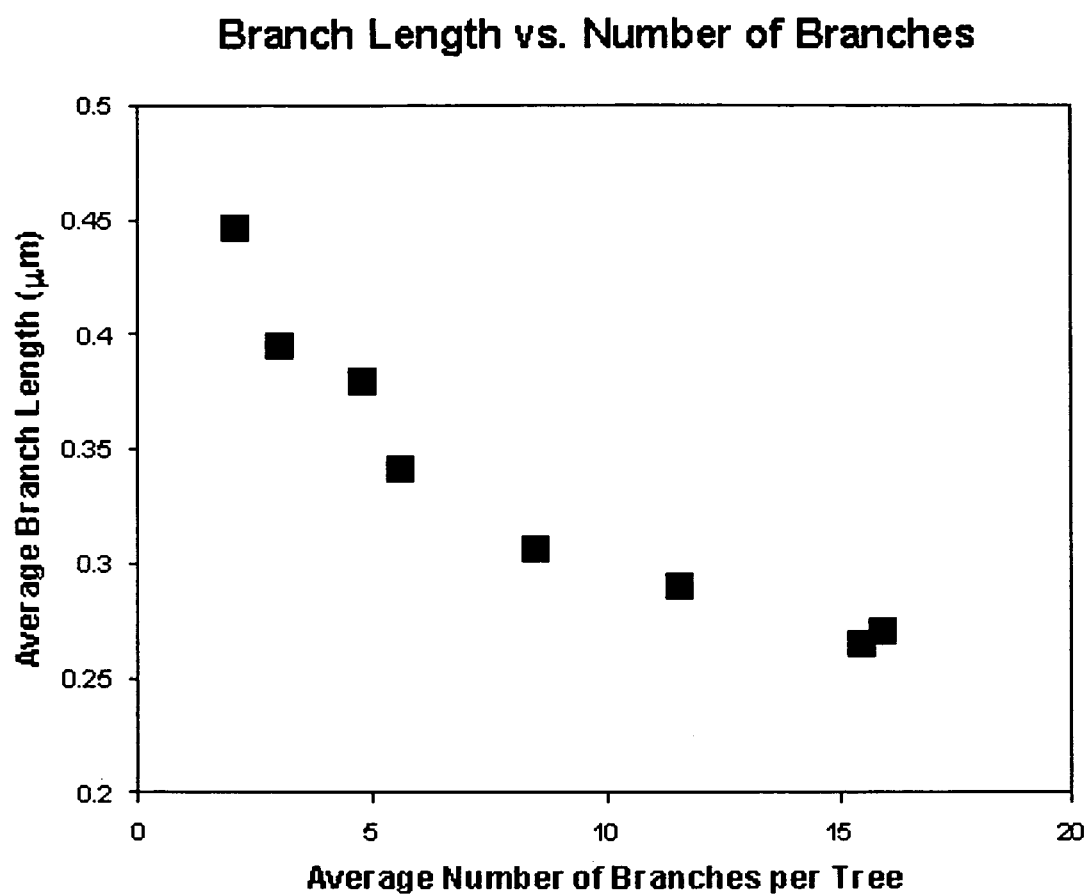

The second route, however, allows for Ga to be incorporated into the entire tree at a constant rate, independent of number of seed particles. Thus, for higher numbers of branches, less Ga is incorporated per branch as a function of time. Branch length is then a function of number of branches. It is also seen that average branch length decreases with increasing branch density (FIG. 3B). Branch length is, however, independent of branch position on the trunk, indicating that surface diffusion is not a limiting criterion under the chosen conditions.

Particle deposition on the substrate is preferably performed by means of electrostatic precipitation, whereby an electric field is applied through which the aerosol flow passes. The distribution of seed particles on the sample is determined by the interplay between Brownian forces and electrostatic forces, and the resulting movement of particles in the electric field. See Krinke et al., "Microscopic aspects of the deposition of nanoparticles from the gas phase", *Journal of Aerosol Science* 33 (10), pages 1341-1359 (October 2002). This distribution directly determines the distribution of branches. Computer simulations indicate that varying deposition parameters will result in variance in the resulting particle distribution. Based on these simulations, conditions were selected so to ensure that fewer particles will deposit on the substrate, and that particles tend to distribute evenly along the trunk; experimental results have been consistent with this prediction.

Figure 2C:
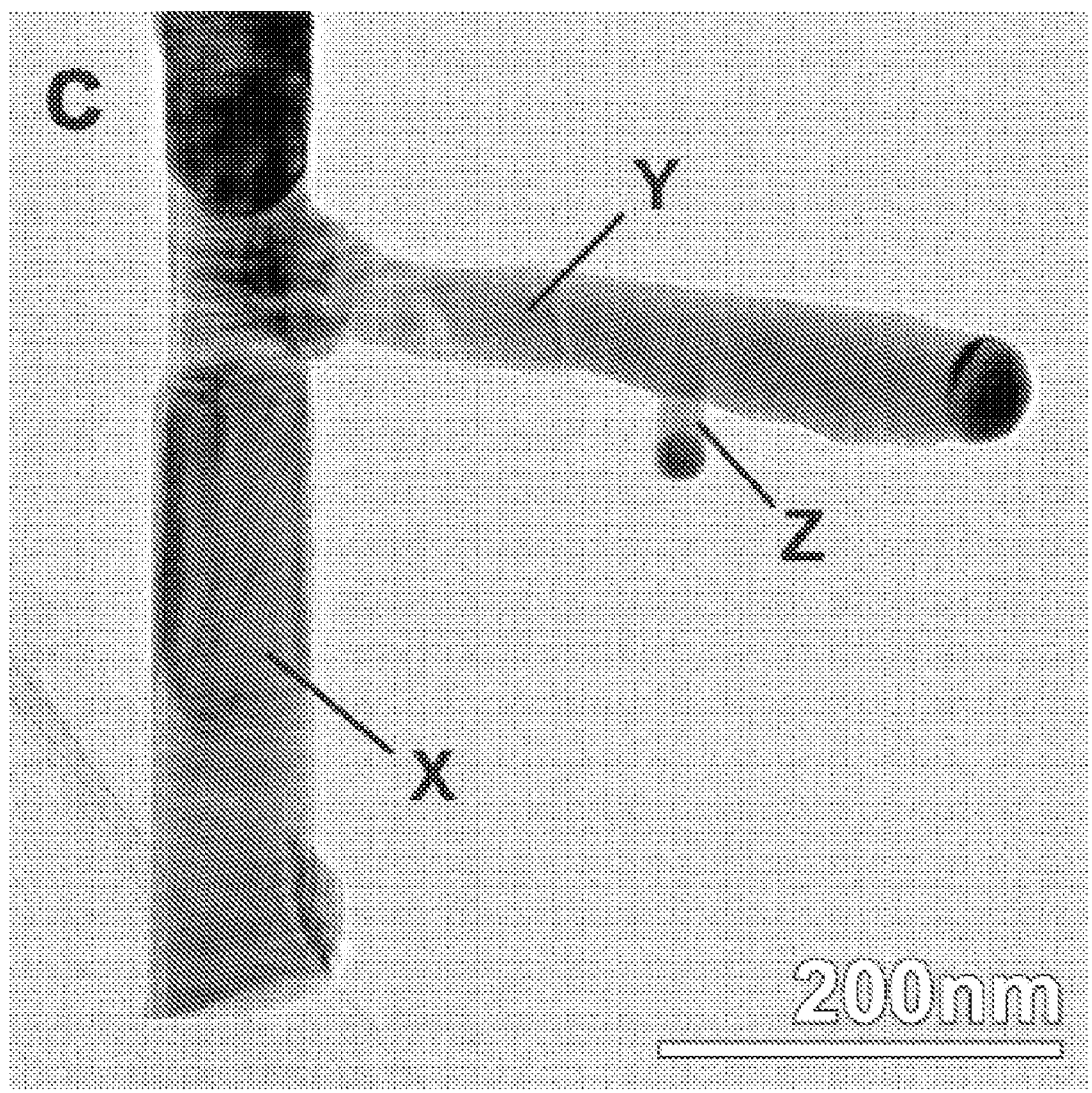

A third level of nanowires has been grown, resembling sub-branches or "twigs". FIG. 2C is an image of such a structure, wherein the first, second, and third nanowhiskers are designated by reference characters X, Y, and Z, respectively. Again, the aerosol technique is ideally suited to deposition of particles on branches. Third-level GaP branches grow from second-level branches in the other <111>B directions, and length and diameter can be controlled by selection of growth conditions. On trees with few second-level branches, gold particles also deposit on the trunk, resulting in additional branches equivalent to those grown on second-level branches. In addition, InP third-level branches were grown on GaP trees; preliminary results indicate these maintain the <111>B growth direction.

Figure 4A:
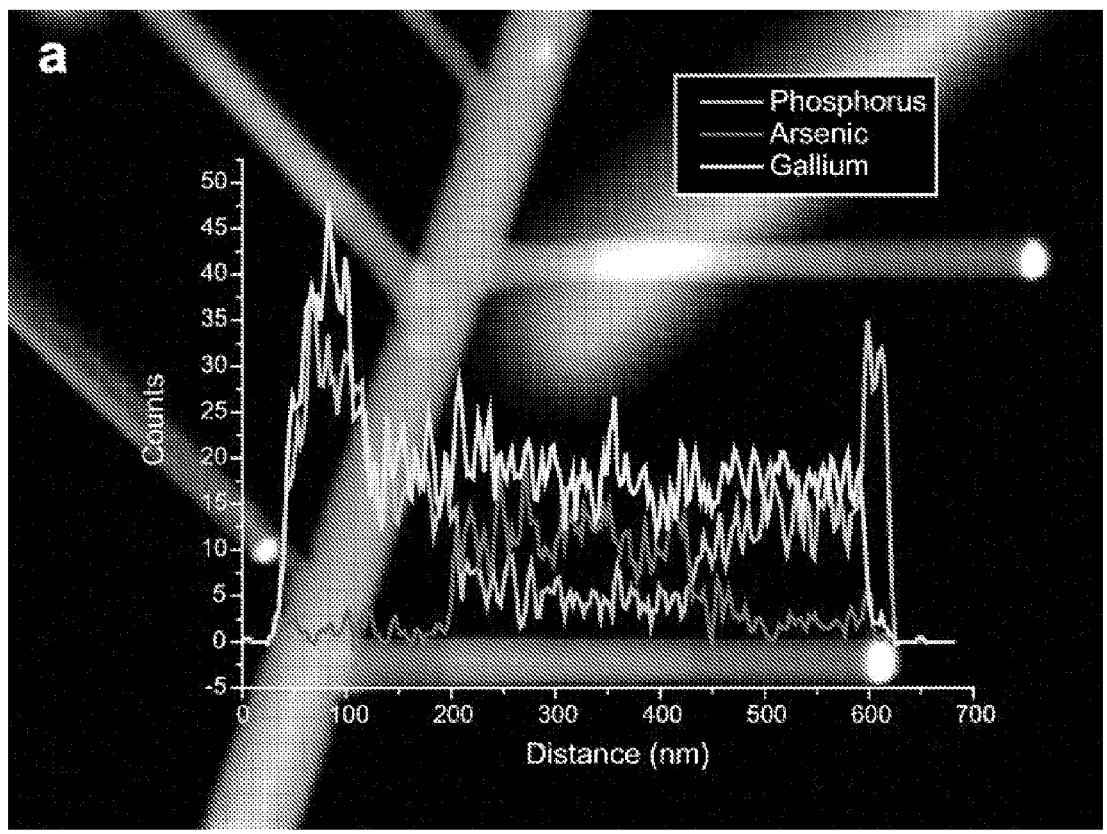
FIGS. 4A and 4B show nanostructures containing GaP—GaAsP double heterostructure in the nanowhisker branches of FIG. 1.
Figure 4B:
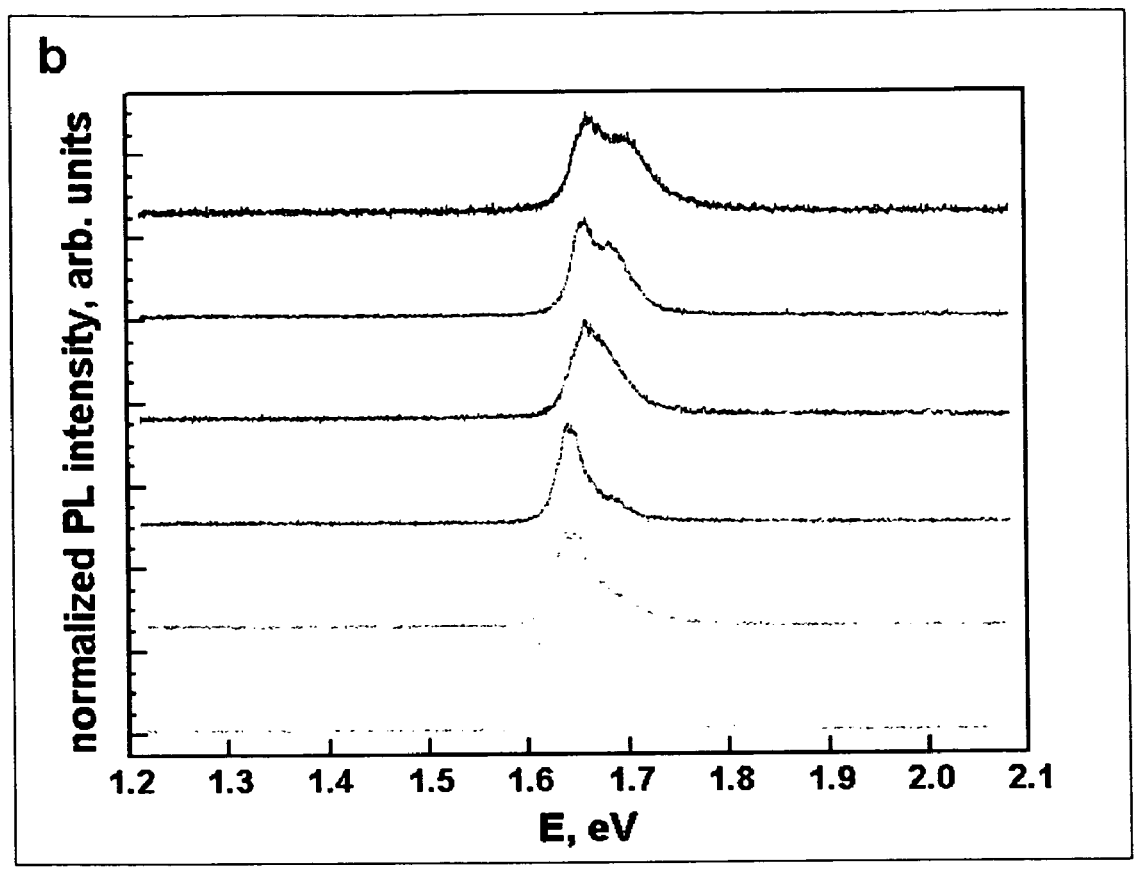

Different materials may be incorporated into the nanostructures, by varying the composition of each level and within individual nanowires. This will allow different device functionality characteristics to be incorporated. To illustrate this potential InP nanowhisker branches were grown on GaP nanowhisker trunks. As well, GaP nanotrees with segments of GaAsP in the branches were also produced (FIG. 4A); position and length of these segments is controlled with a high degree of precision. These trees exhibit similar morphology to homogeneous GaP trees. The photoluminescence data shown in FIG. 4B shows a position of the luminescence peak consistent with a GaAsP segment with a P/As ratio of 0.08; note the peak position (around 1.67 eV) is very consistent over the six different trees. By alloying with As, it is possible to continuously shift the emission wavelength from the bandgap of GaP (about 550 nm) up towards that of GaAs (about 900 nm).

Figure 5:
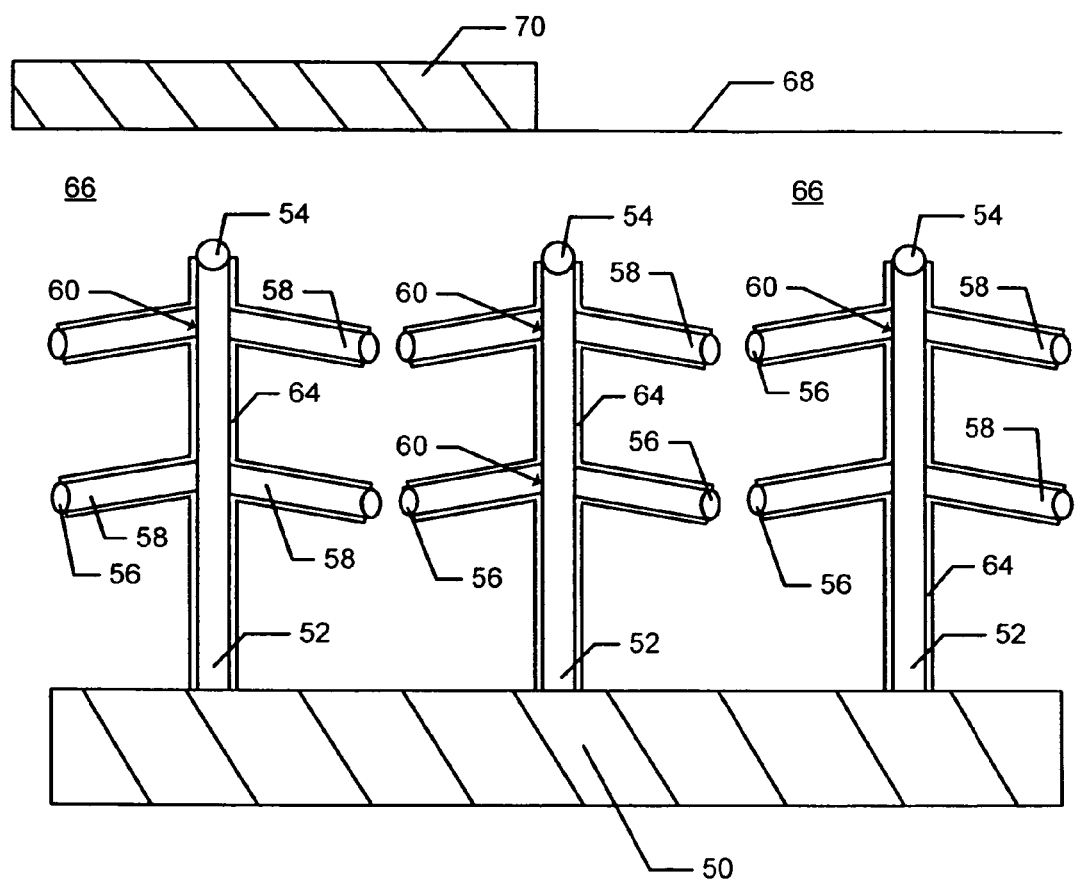
FIG. 5 is a schematic cross-sectional view of a structure incorporating nanostructures of the invention and providing a solar cell array.

Referring now to FIG. 5, this is a schematic cross-sectional view of a solar cell array in accordance with the invention. A substrate 50 of an appropriate semi-conductor material (e.g., GaP) has formed on its upper surface a regular array of first level or trunk nanowhiskers 52. These nanowhiskers are produced from catalytic particles 54 formed on the substrate surface, preferably by an NIL (nanoimprint lithography) process. The first level nanowhiskers are formed of GaP, for example, which is a suitable material for producing photoelectricity. The nanowhiskers 52 are produced by the MOCVD process and subsequently, in the manner described above, a second set of catalytic particles 56 are deposited on the sides the nanowhiskers 52 by aerosol deposition. A second stage of nanowhisker growth is then conducted to produce transversely extending branch or second level nanowhiskers 58 from the sides of first level nanowhiskers 56. The second level nanowhiskers 58 are formed of GaAsP and form PN junctions 60 with the first level nanowhiskers 52.

This process may then be repeated (not shown for clarity) to deposit a third set of catalytic particles on the sides of second level nanowhiskers and an MOVCD process thereafter produces third level nanowhiskers extending laterally from the sides of the second level nanowhiskers. The composition of the third level nanowhiskers can be appropriately selected to form PN junctions with the second level nanowhiskers 58.

Each nanostructure (nanotree), comprising a nanowhisker 52 and associated nanowhiskers 58, is then encased in an electrically insulating material. For example, the nanostructures may be encased in aluminium phosphide, as at 64, by changing the growth conditions of the MOCVD process and the growth materials at the end of the second nanowhisker growth stage. The aluminium phosphide is then oxidised to produce aluminium oxide (sapphire). This provides electrical isolation of the first, second and third nanowhiskers from a conductive transparent polymer 66, or other suitable conductive matrix, that is subsequently deposited over the nanotrees. This conductive polymer provides electrical contact to the catalytic particles at the end of the nanowhiskers and thus provides a means for applying an electrical voltage between the ends of the nanowhiskers and the substrate. Polymer 66 also provides a flat top surface 68 for the structure, and permits formation of a terminal 70 thereon.

Thus in operation, when the structure is exposed to light and an electric voltage is applied to catalytic particle contacts 54, 56, photocurrents are generated within the nanowhiskers 52, 58, and in particular in PN junctions 60, and the photocurrents are swept out of the device.

To improve operation, heterojunctions may be formed within second level nanowhiskers 58 by forming segments of a different band gap material within the second level nanowhiskers during growth (by rapid switching of gaseous constituents); this is not shown for clarity. These junctions provide sources of photo electricity. Further, such segments of different materials may permit the nanostructures to respond to a variety of light wavelengths. Similarly, heterojunctions may be formed in subsequent level branches and/or in the first level nanowhiskers. Such heterojunctions may be used in place of, or in addition to, PN junctions between successive nanowhisker levels, as desired.

Thus, the structure shown in FIG. 5 allows the use of single-crystalline nanotree structures for photovoltaic conversion of photons into electricity, a less complex and more efficient structure than Grätzel cells, referred to above.

In order to solve the problem of how individual nanostructures are to be contacted from the counter-electrode of the solar cell, conducting (and, to the solar radiation, transparent) polymer 66 is used to contact the gold catalytic particles that terminate each branch nanowhisker. For this contacting to be well controlled and functional, the branches are electrically isolated relative to the conducting polymer. This is achieved in that stem, branches and twigs will during growth (after wire growth) be covered by AlP 64 in a core-shell configuration. The AlP can, in a controlled process, be transformed into $Al_2O_3$, giving isolation of all branches relative to the conducting polymer. The conducting polymer will also provide the flat top-surface of the solar cell structure.

Heterostructures within nanostructures are ideal for light-emission, with each heterostructure acting as a nano-LED. As an illustration of the potential of incorporating functional heterostructures in branches, luminescence measurements were taken from individual GaP nanotrees containing 200 nm-long segments of the approximate composition $GaAs_{0.9}P_{0.1}$, showing sharp emission at about 1.67 eV (FIG. 4B). This emission is clearly associated with the designed GaAsP double heterostructure segments, illustrating the potential advantage of functional elements in a nanotree structure for, e.g., photonics applications.

Figure 6:
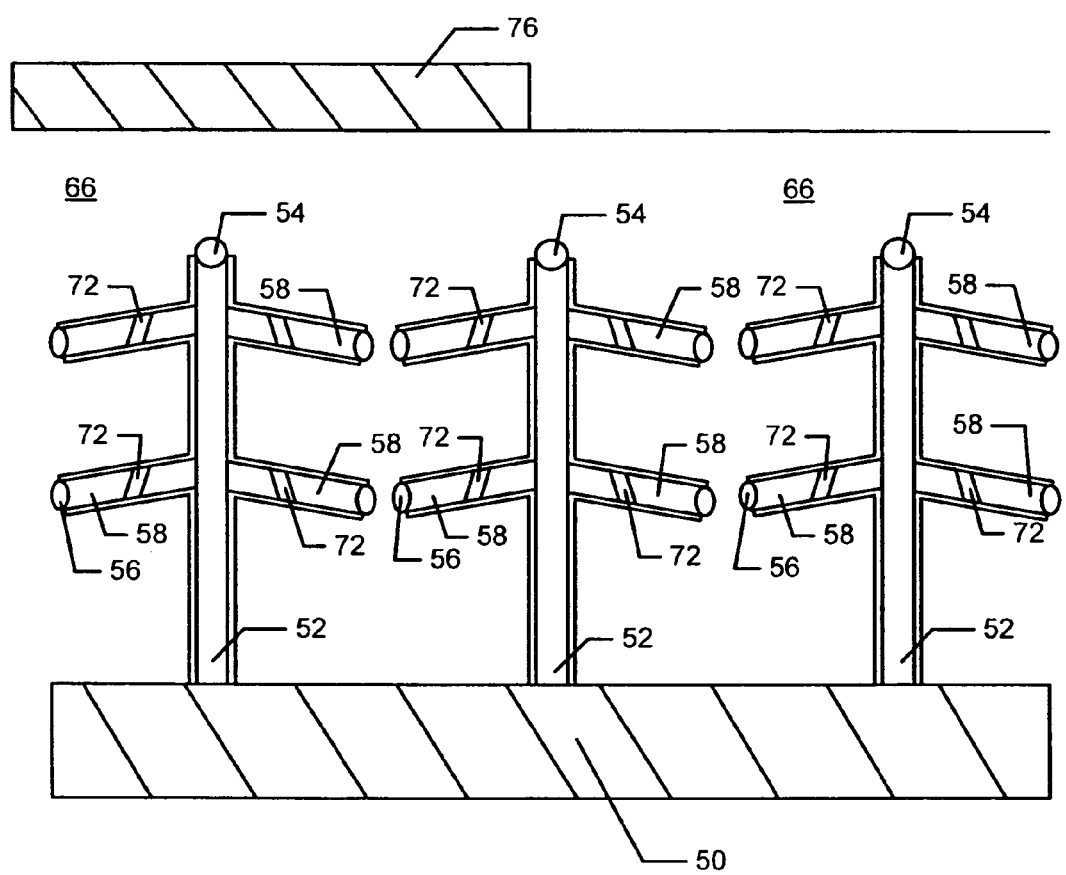
FIG. 6 is a schematic cross-sectional view of a structure incorporating nanostructures of the invention and providing a light-emitting panel.

Such nano-LEDs are incorporated in a light-emitting panel, as indicated schematically in FIG. 6, where similar parts to those of FIG. 5 are denoted by the same reference numerals. The structure of FIG. 5 is modified in that segments 72 of GaAsP are formed in each second level nanowhisker 58, which is formed of GaP in this example. Such segments and the bounding heterojunctions create LEDs. A terminal of transparent ITO material 76 is positioned on conductive polymer 66. Application of voltage between the terminal 76 and the substrate energises LED segments to produce light. In a modification (not shown for clarity), third level or twig nanowhiskers are grown from second level nanowhiskers, with heterojunctions therein, to create further LEDs: this provides a more dense array of LEDs. Of course, heterojunctions may similarly be provided in the first or trunk nanowhiskers to form LEDs therein. In a further modification, by providing a large number of separately addressable electrodes over parts of the structure that are isolated from one another, the structure provides an addressable display panel.

Thus, in FIG. 6 opposite charge carriers are injected from the branches and the gold-particles and made to recombine in designed heterostructures, in which way these will operate as nano-scale light-emitting diodes (LEDs). The overall effect is to provide a light-emitting panel. The multiple-branch layout will be beneficial for this application and any defects or burn-out of individual LEDs will only marginally affect the overall performance of such a light-emitting panel.

Figure 7A:
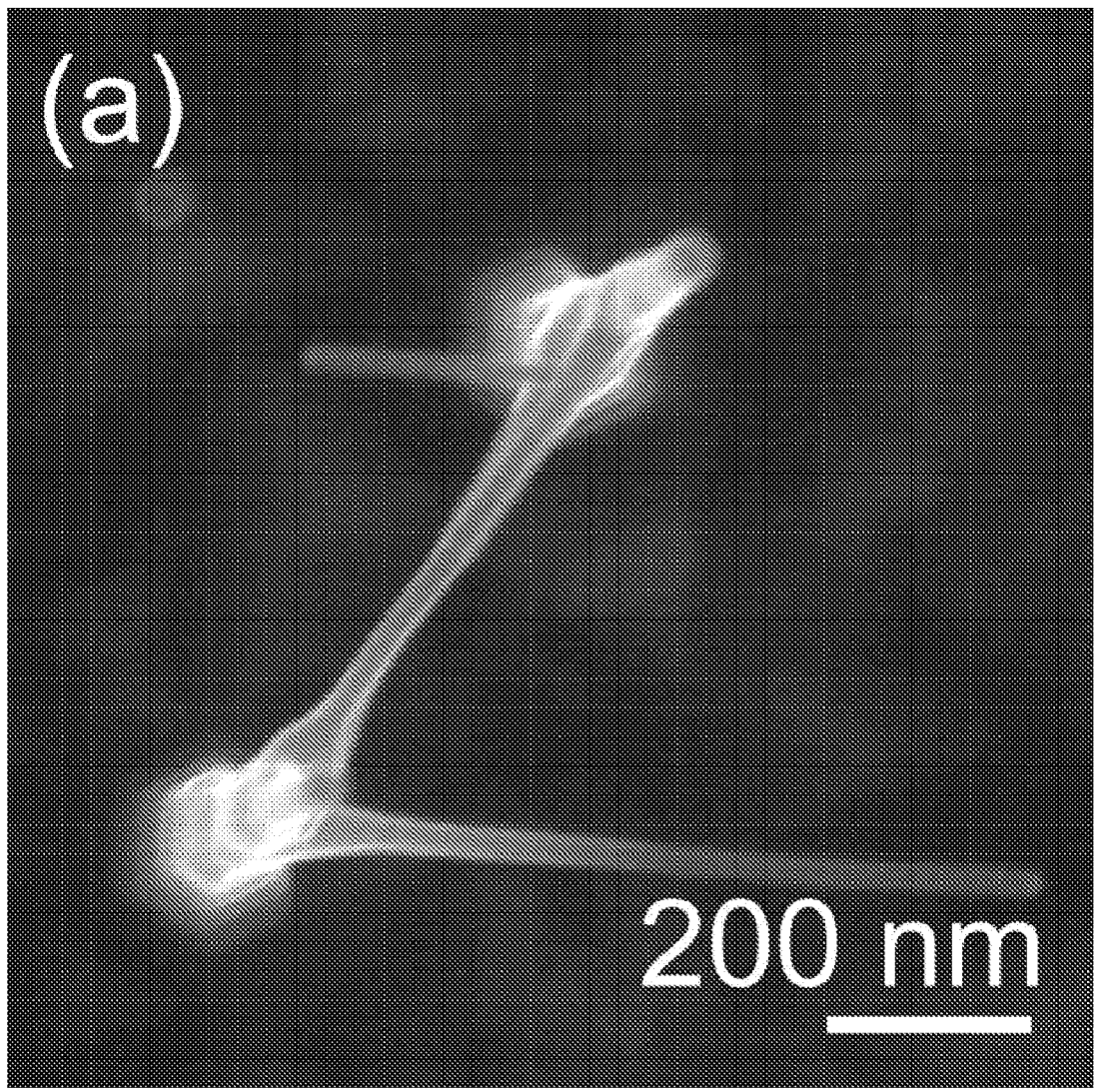
FIGS. 7A and 7B are SEM images showing interconnected InAs nanostructures in accordance with the invention, again formed by aerosol catalytic particle deposition follows by MOVPE growth.
Figure 7B:
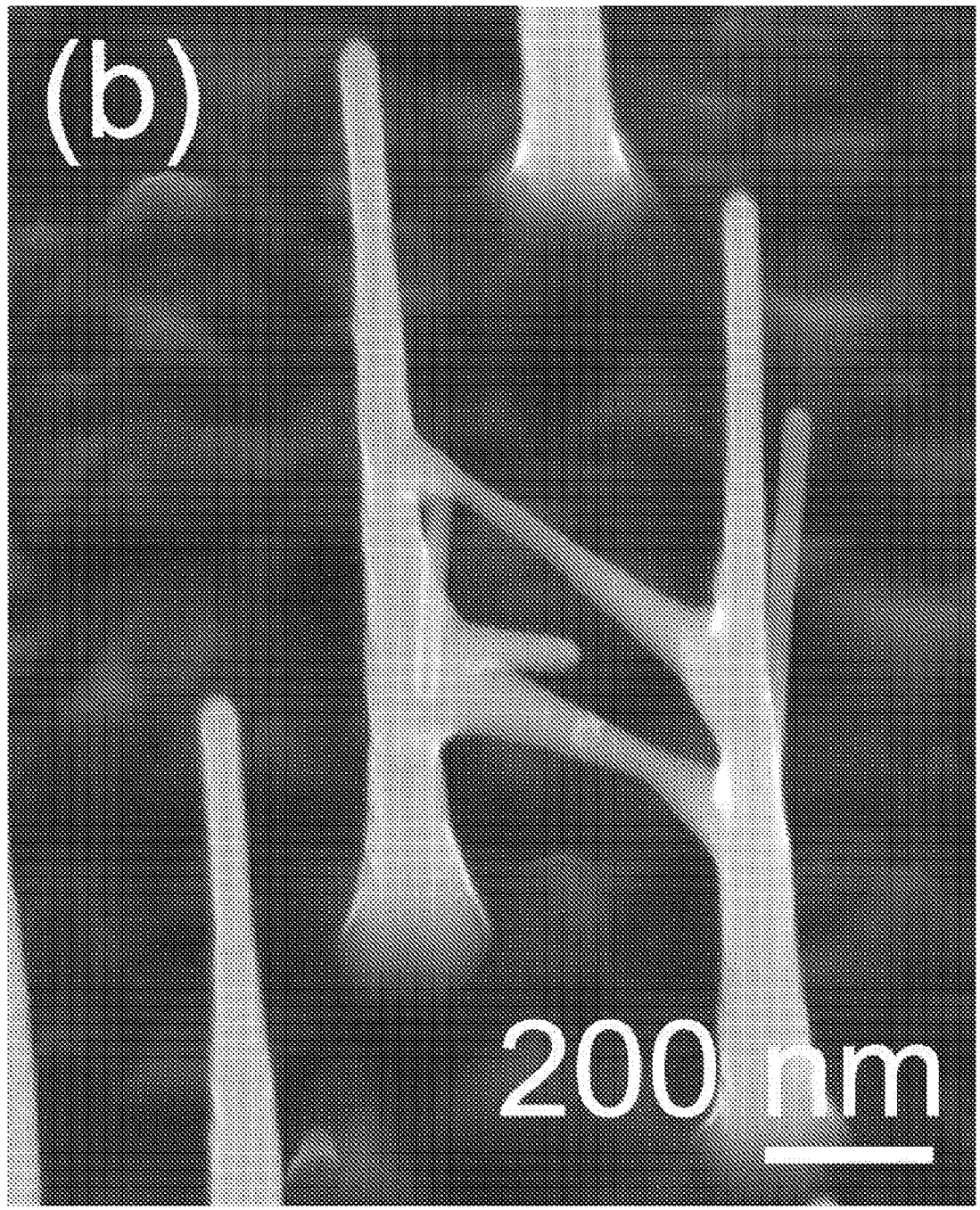

FIGS. 7A and 7B are SEM images of InAs nanostructures grown by the above described techniques, using aerosol deposition of catalytic particles and MOVPE growth. FIGS. 7A and 7B show a pair of nanotree structures having their first level nanowhiskers or trunks interconnected by a pair of second level nanowhiskers or branches. The trunks are positioned in such direction and distance, and the connecting branches grown sufficiently long that each connecting branch is brought into electrical contact, through its respective catalytic particle, with the adjacent trunk.

Figure 8A:
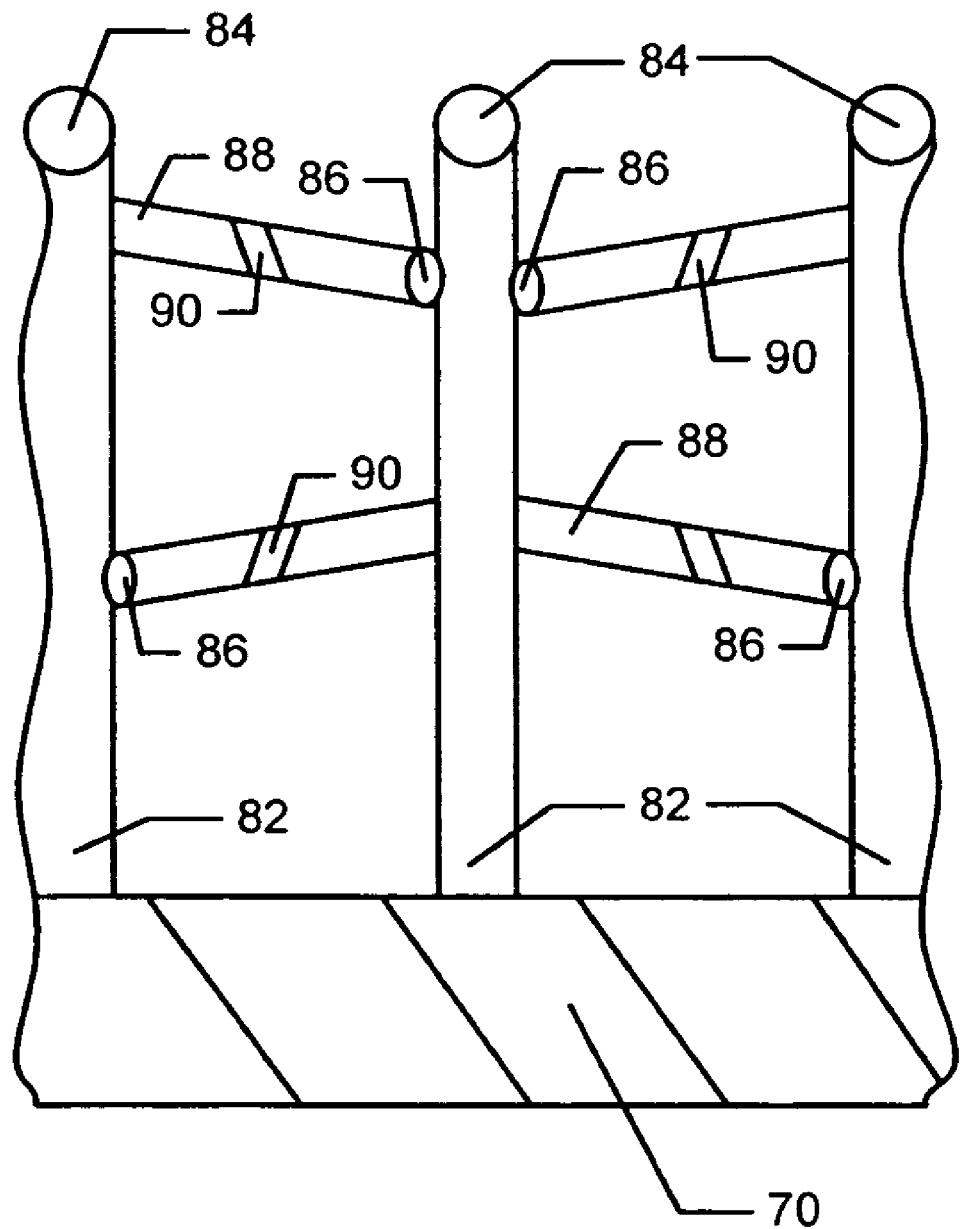
FIGS. 8A and 8B are schematic cross-sectional views of neural network structures each comprising a large number of nanostructures of the invention positioned closely together to make electrical contact with one another.

Referring now to FIG. 8A, there is shown a structure providing a neural network comprising interconnected nanostructures or nanotrees in accordance with the invention. A substrate 70 has a precisely positioned array of first level nanowhiskers 82 formed on the substrate surface. This is effected by forming on the surface catalytic particles 84 by an NIL process, and then, as disclosed in copending U.S. patent application Ser. No. 10/751,944, to Samuelson et al., the contents of which are herein incorporated by reference, forming the nanowhiskers to extend exactly from the catalytic particles sites. A second stage of formation is then carried out wherein second catalytic particles 86 are deposited on the sides of nanowhiskers 82 by an aerosol deposition process and then second level nanowhiskers 88 are grown from the sides of nanowhiskers 82. The nanowhiskers 82 are positioned sufficiently closely together as shown and the second level nanowhiskers are grown sufficiently long that on average, on a statistical basis, electrical contact is achieved between two or three second level nanowhiskers grown on each first level nanowhisker 82 with adjacent first level nanowhiskers from neighbouring nanotree structures.

Figure 8B:
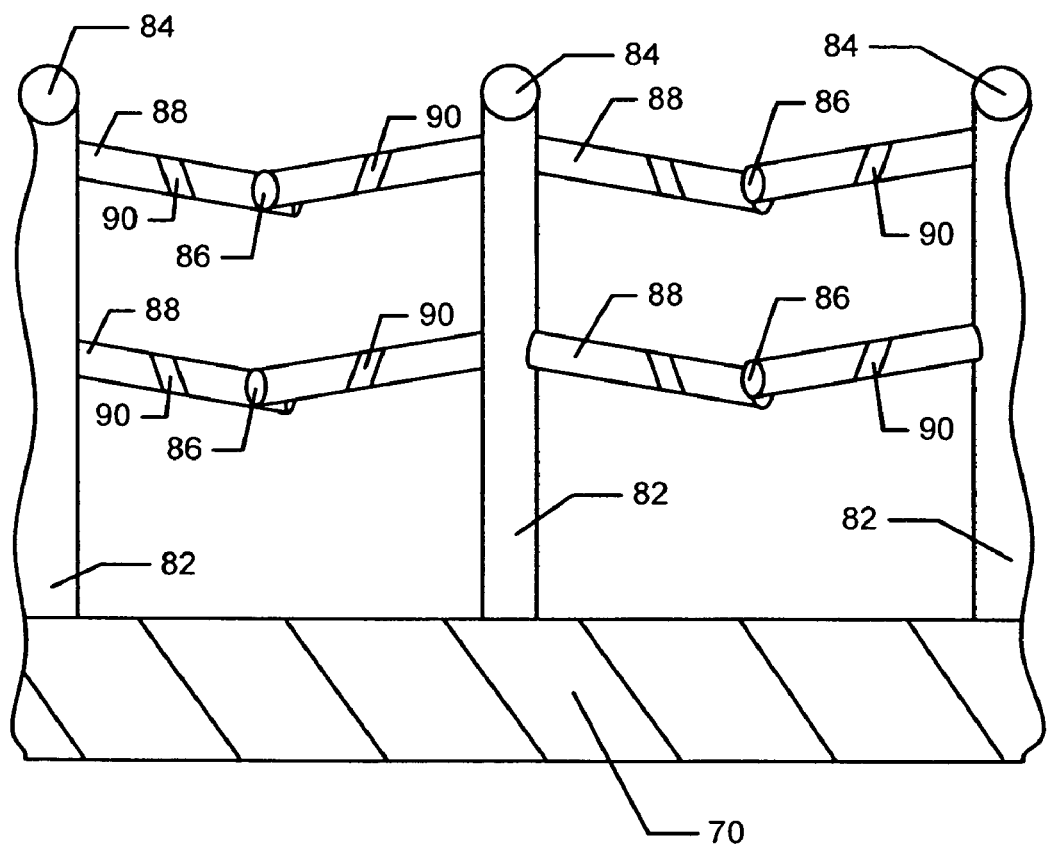

Further during the formation of second level nanowhiskers 88, growth conditions and materials are changed such as to insert a segment 90 of a different material having a markedly different band gap (e.g., an InP segment in an InAs whisker). This forms a tunnel barrier arrangement. In operation, when electric voltage is applied to the arrangement and a charge accumulates at tunnel barrier segments 90, when a threshold voltage is overcome, electric current will flow through the tunnel barriers in a way analogous to the synapse of a neural network. Additionally, or alternatively, tunnel barriers may be incorporated into the trunk nanowhiskers by appropriate modification of growth conditions and materials thereof as previously described. Moreover, interconnections may be made between adjacent nanotree structures through branch-to-branch connections, as shown schematically in FIG. 8B.

The invention claimed is:

1. A method of forming a nanostructure, comprising:
   a first stage which includes providing at least one first catalytic particle on a substrate surface, and growing a first nanowhisker by a VLS process via each first catalytic particle; and
   a second stage which includes depositing on a peripheral surface of at least one said first nanowhisker at least one second catalytic particle, and growing, by a VLS process from each second catalytic particle, a second nanowhisker extending transversely from the peripheral surface of the respective first nanowhisker,
   wherein said providing comprises forming an aerosol flow comprising said first catalytic particles and depositing a plurality of said first catalytic particles from the aerosol flow on the substrate surface.

2. The method as claimed in claim 1, further comprising a third stage which includes depositing, on a peripheral surface of at least one said second nanowhisker, at least one third catalytic particle, and growing by a VLS process, from each third catalytic particle, a third nanowhisker extending transversely from the peripheral surface of the respective second nanowhisker.

3. A method as claimed in claim 1, wherein said providing further comprises controlling a density of the aerosol flow to control a number of said first catalytic particles that is deposited on the substrate surface.

4. A method as claimed in claim 1, wherein the first catalytic particles in the aerosol flow have a uniform size.

5. A method as claimed in claim 1, wherein the first catalytic particles in the aerosol flow are singly charged.

6. A method as claimed in claim 1, wherein the providing comprises electrostatically precipitating the first catalytic particles on the substrate surface.

7. A method as claimed in claim 1, wherein said depositing comprises forming an aerosol flow comprising the second catalytic particles and depositing the second catalytic particles on the peripheral surface of the first nanowhiskers from the aerosol flow.

8. A method as claimed in claim 7, wherein said depositing comprises electrostatically precipitating the second catalytic particles on the peripheral surface of the first nanowhiskers.

9. A method as claimed in claim 7, wherein the depositing comprises controlling a density of the aerosol flow to achieve a desired number of the second catalytic particles that are deposited on each first nanowhisker.

10. A method as claimed in claim 9, wherein the number of the second catalytic particles that is deposited on each first nanowhisker is the same to within ±10%.

11. A method as claimed in claim 7, wherein the second catalytic particles on the peripheral surface of each first nanowhisker are generally evenly distributed on the peripheral surface, in a circumferential direction of the respective first nanowhisker.

12. A method as claimed in claim 7, wherein the second catalytic particles are generally evenly distributed on the peripheral surface of each first nanowhisker, in a lengthwise direction of the respective first nanowhisker.

13. A method as claimed in claim 1, wherein a length of the second nanowhisker is a function of a time of said growing the second nanowhisker.

14. A method as claimed in claim 1, wherein a length of the second nanowhisker is a function of a reagent concentration in said growing the second nanowhisker.

15. A method as claimed in claim 1, wherein a length of the second nanowhisker is a function of a temperature of said growing the second nanowhisker.

16. A method as claimed in claim 1, wherein a length of the second nanowhiskers is controlled to within ±5% a of a desired length.

17. A method as claimed in claim 1, wherein the growing a first nanowhisker comprises growing first nanowhiskers in a desired orientation relative to the substrate surface.

18. A method as claimed in claim 17, wherein the substrate surface is a (111) substrate surface and the desired orientation is <111> relative to the (111) substrate surface.

19. A method as claimed in claim 17, wherein an orientation of the second nanowhiskers is determined by a crystal direction of the respective first nanowhiskers.

20. A method as claimed in claim 19, wherein the second nanowhiskers have three growth directions determined by the crystal direction of the respective first nanowhiskers.

21. A method as claimed in claim 19, wherein the second nanowhiskers have six growth directions determined by the crystal direction of the respective first nanowhiskers.

22. A method as claimed in claim 19, wherein the second nanowhiskers have four growth directions determined by the crystal direction of the respective first nanowhiskers.

23. A method as claimed in claim 19, wherein the second nanowhiskers have a <111> orientation relative to a crystal structure of the substrate, said orientation is determined by crystal facets of the respective first nanowhiskers.

24. A method of forming a nanostructure, comprising:
a first stage which includes providing at least one first catalytic particle on a substrate surface, and growing a first nanowhisker by a VLS process via each said first catalytic particle; and
n following stages, where n is an integer greater than or equal to 2, and each following stage includes depositing on a peripheral surface of at least one preceding nanowhisker grown in the preceding stage, at least one further catalytic particle, and
growing by a VLS process, from each further catalytic particle, a further nanowhisker extending transversely from the peripheral surface of the respective preceding nanowhisker, wherein, in each of the following stages, the depositing the further catalytic particles on the preceding nanowhiskers comprises forming an aerosol flow comprising the further catalytic particles and depositing the further catalytic particles from the aerosol flow on the peripheral surface of the at least one preceding nanowhisker.

25. A method as claimed in claim 24, wherein, in each of the following stages, the depositing the further catalytic particles on the preceding nanowhiskers comprises electrostatically precipitating the further catalytic particles on the peripheral surface of the at least one preceding nanowhisker.

26. A method as claimed in claim 24, wherein the depositing the further catalytic particles on the preceding nanowhiskers comprises controlling a density of the aerosol flow to achieve a desired number of the further catalytic particles that are deposited on each preceding nanowhisker.

27. A method as claimed in claim 26, wherein the number of the further catalytic particles that is deposited on each preceding nanowhisker is the same to within ±10%.

28. A method as claimed in claim 25, wherein the further catalytic particles are generally evenly distributed on the peripheral surface of each preceding nanowhisker, in a circumferential direction of the preceding nanowhisker.

29. A method as claimed in claim 25, wherein the further catalytic particles are generally evenly distributed on the peripheral surface of each preceding nanowhisker, in a lengthwise direction of the preceding nanowhisker.

30. A method as claimed in claim 24, wherein a length of the further nanowhisker is a function of a time of the growing the further nanowhisker.

31. A method as claimed in claim 24, wherein a length of the further nanowhisker is a function a reagent concentration in said growing the second nanowhisker.

32. A method as claimed in claim 24, wherein a length of the further nanowhisker is a function of a temperature of the growing of the further nanowhisker.

33. A method as claimed in claim 24, wherein a length of the further nanowhiskers is controlled to within ±5% of a desired length.

34. A method as claimed in claim 24, wherein an orientation of the further nanowhiskers is determined by a crystal direction of the preceding nanowhiskers.

35. A method of forming a nanostructure, comprising:
a first stage which includes providing at least one first catalytic particle on a substrate, and forming a first one-dimensional nanoelement via each said first catalytic particle; and
a second stage which includes depositing on a peripheral surface of at least one said first one-dimensional nanoelement, at least one second catalytic particle, and forming from each said second catalytic particle, a second one-dimensional nanoelement extending transversely from the peripheral surface of the respective first one-dimensional nanoelement,
wherein said providing comprises forming an aerosol flow comprising said first catalytic particles and depositing a plurality of said first catalytic particles on the substrate from the aerosol flow.

36. The method as claimed in claim 35, further comprising a third stage which includes depositing on a peripheral surface of at least one said second one-dimensional nanoelement, at least one third catalytic particle, and growing by a VLS process, from each third catalytic particle, a third one-dimensional nanoelement extending transversely from the peripheral surface of the respective second one-dimensional nanoelement.

37. A method as claimed in claim 35, wherein said providing further comprises controlling a density of the aerosol flow to control a number of said first catalytic particles that is deposited on the substrate.

38. A method as claimed in claim 35, wherein the first catalytic particles in the aerosol flow have a uniform size.

39. A method as claimed in claim 35, wherein said first catalytic particles in the aerosol flow are singly charged.

40. A method as claimed in claim 35, wherein the providing comprises electrostatically precipitating the first catalytic particles on the substrate.

41. A method as claimed in claim 35, wherein the depositing the second catalytic particles on the first one-dimensional nanoelements comprises forming an aerosol flow comprising the second catalytic particles and depositing the second catalytic particle on the peripheral surface of the first one-dimensional nanoelement from the aerosol flow.

42. A method as claimed in claim 41, wherein the depositing the second catalytic particles on the first one-dimensional nanoelements comprises electrostatically precipitating the second catalytic particles on the peripheral surface of the first one-dimensional nanoelement.

43. A method as claimed in claim 41, wherein the depositing the second catalytic particles on the first one-dimensional nanoelement comprises controlling a density of the aerosol flow to achieve a desired number of the second catalytic particles on each first one-dimensional nanoelement.

44. A method as claimed in claim 43, wherein the number of the second catalytic particles that is deposited on each first one-dimensional nanoelement is the same to within ±10%.

45. A method as claimed in claim 41, wherein the second catalytic particles on the peripheral surface-of each first one-dimensional nanoelement are generally evenly distributed on the peripheral surface, in a circumferential direction of the respective first one-dimensional nanoelement.

46. A method as claimed in claim 41, wherein the second catalytic particles are generally evenly distributed on the peripheral surface of each first one-dimensional nanoelement, in a lengthwise direction of the respective first one-dimensional nanoelement.

47. A method of forming a nanostructure, comprising:
- a first stage which includes providing at least one first catalytic particle on a substrate surface, and growing a first nanowhisker by a VLS process via each first catalytic particle; and
- a second stage which includes depositing on a peripheral surface of at least one said first nanowhisker at least one second catalytic particle, and growing, by a VLS process from each second catalytic particle, a second nanowhisker extending transversely from the peripheral surface of the respective first nanowhisker,
- wherein the providing comprises electrostatically precipitating the first catalytic particles on the substrate surface.

48. The method as claimed in claim 47, further comprising a third stage which includes depositing, on a peripheral surface of at least one said second nanowhisker, at least one third catalytic particle, and growing by a VLS process, from each third catalytic particle, a third nanowhisker extending transversely from the peripheral surface of the respective second nanowhisker.

49. A method as claimed in claim 47, wherein said depositing comprises forming an aerosol flow comprising the second catalytic particles and depositing the second catalytic particles on the peripheral surface of the first nanowhiskers from the aerosol flow.

50. A method as claimed in claim 49, wherein said depositing comprises electrostatically precipitating the second catalytic particles on the peripheral surface of the first nanowhiskers.

51. A method as claimed in claim 49, wherein the depositing comprises controlling a density of the aerosol flow to achieve a desired number of the second catalytic particles that are deposited on each first nanowhisker.

52. A method as claimed in claim 51, wherein the number of the second catalytic particles that is deposited on each first nanowhisker is the same to within ±10%.

53. A method as claimed in claim 49, wherein the second catalytic particles on the peripheral surface of each first nanowhisker are generally evenly distributed on the peripheral surface, in a circumferential direction of the respective first nanowhisker.

54. A method as claimed in claim 49, wherein the second catalytic particles are generally evenly distributed on the peripheral surface of each first nanowhisker, in a lengthwise direction of the respective first nanowhisker.

55. A method as claimed in claim 47, wherein a length of the second nanowhisker is a function of a time of said growing the second nanowhisker.

56. A method as claimed in claim 47, wherein a length of the second nanowhisker is a function of a reagent concentration in said growing the second nanowhisker.

57. A method as claimed in claim 47, wherein a length of the second nanowhisker is a function of a temperature of said growing the second nanowhisker.

58. A method as claimed in claim 47, wherein a length of the second nanowhiskers is controlled to within ±5% of a desired length.

59. A method as claimed in claim 47, wherein the growing a first nanowhisker comprises growing first nanowhiskers in a desired orientation relative to the substrate surface.

60. A method as claimed in claim 59, wherein the substrate surface is a (111) substrate surface and the desired orientation is <111> relative to the (111) substrate surface.

61. A method as claimed in claim 59, wherein an orientation of the second nanowhiskers is determined by a crystal direction of the respective first nanowhiskers.

62. A method as claimed in claim 61, wherein the second nanowhiskers have three growth directions determined by the crystal direction of the respective first nanowhiskers.

63. A method as claimed in claim 61, wherein the second nanowhiskers have six growth directions determined by the crystal direction of the respective first nanowhiskers.

64. A method as claimed in claim 61, wherein the second nanowhiskers have four growth directions determined by the crystal direction of the respective first nanowhiskers.

65. A method as claimed in claim 61, wherein the second nanowhiskers have a <111> orientation relative to a crystal structure of the substrate, said orientation is determined by crystal facets of the respective first nanowhiskers.

66. A method of forming a nanostructure, comprising:
- a first stage which includes providing at least one first catalytic particle on a substrate surface, and growing a first nanowhisker by a VLS process via each first catalytic particle; and
- a second stage which includes depositing on a peripheral surface of at least one said first nanowhisker at least one second catalytic particle, and growing, by a VLS process from each second catalytic particle, a second nanowhisker extending transversely from the peripheral surface of the respective first nanowhisker,
- wherein said depositing comprises forming an aerosol flow comprising the second catalytic particles and depositing the second catalytic particles on the peripheral surface of the first nanowhiskers from the aerosol flow.

67. The method as claimed in claim 66, further comprising a third stage which includes depositing, on a peripheral surface of at least one said second nanowhisker, at least one third catalytic particle, and growing by a VLS process, from each third catalytic particle, a third nanowhisker extending transversely from the peripheral surface of the respective second nanowhisker.

68. A method as claimed in claim 66, wherein said depositing comprises electrostatically precipitating the second catalytic particles on the peripheral surface of the first nanowhiskers.

69. A method as claimed in claim 66, wherein the depositing comprises controlling a density of the aerosol flow to achieve a desired number of the second catalytic particles that are deposited on each first nanowhisker.

70. A method as claimed in claim 69, wherein the number of the second catalytic particles that is deposited on each first nanowhisker is the same to within ±10%.

71. A method as claimed in claim 66, wherein the second catalytic particles on the peripheral surface of each first nanowhisker are generally evenly distributed on the peripheral surface, in a circumferential direction of the respective first nanowhisker.

72. A method as claimed in claim 66, wherein the second catalytic particles are generally evenly distributed on the peripheral surface of each first nanowhisker, in a lengthwise direction of the respective first nanowhisker.

73. A method as claimed in claim 66, wherein a length of the second nanowhisker is a function of a time of said growing the second nanowhisker.

74. A method as claimed in claim 66, wherein a length of the second nanowhisker is a function of a reagent concentration in said growing the second nanowhisker.

75. A method as claimed in claim 66, wherein a length of the second nanowhisker is a function of a temperature of said growing the second nanowhisker.

76. A method as claimed in claim 66, wherein a length of the second nanowhiskers is controlled to within ±5% of a desired length.

77. A method as claimed in claim 66, wherein the growing a first nanowhisker comprises growing first nanowhiskers in a desired orientation relative to the substrate surface.

78. A method as claimed in claim 77, wherein the substrate surface is a (111) substrate surface and the desired orientation is <111> relative to the (111) substrate surface.

79. A method as claimed in claim 77, wherein an orientation of the second nanowhiskers is determined by a crystal direction of the respective first nanowhiskers.

80. A method as claimed in claim 79, wherein the second nanowhiskers have three growth directions determined by the crystal direction of the respective first nanowhiskers.

81. A method as claimed in claim 79, wherein the second nanowhiskers have six growth directions determined by the crystal direction of the respective first nanowhiskers.

82. A method as claimed in claim 79, wherein the second nanowhiskers have four growth directions determined by the crystal direction of the respective first nanowhiskers.

83. A method as claimed in claim 79, wherein the second nanowhiskers have a <111> orientation relative to a crystal structure of the substrate, said orientation is determined by crystal facets of the respective first nanowhiskers.

84. A method of forming a nanostructure, comprising:
a first stage which includes providing at least one first catalytic particle on a substrate surface, and growing a first nanowhisker by a VLS process via each first catalytic particle; and
a second stage which includes depositing on a peripheral surface of at least one said first nanowhisker at least one second catalytic particle, and growing, by a VLS process from each second catalytic particle, a second nanowhisker extending transversely from the peripheral surface of the respective first nanowhisker
wherein the growing a first nanowhisker comprises growing first nanowhiskers in a desired orientation relative to the substrate surface, wherein the substrate surface is a (111) substrate surface and wherein the desired orientation is <111> relative to the (111) substrate surface.

85. The method as claimed in claim 84, further comprising a third stage which includes depositing, on a peripheral surface of at least one said second nanowhisker, at least one third catalytic particle, and growing by a VLS process, from each third catalytic particle, a third nanowhisker extending transversely from the peripheral surface of the respective second nanowhisker.

86. A method as claimed in claim 84, wherein a length of the second nanowhisker is a function of a time of said growing the second nanowhisker.

87. A method as claimed in claim 84, wherein a length of the second nanowhisker is a function of a reagent concentration in said growing the second nanowhisker.

88. A method as claimed in claim 84, wherein a length of the second nanowhisker is a function of a temperature of said growing the second nanowhisker.

89. A method as claimed in claim 84, wherein a length of the second nanowhiskers is controlled to within ±5% of a desired length.

90. A method of forming a nanostructure, comprising:
a first stage which includes providing at least one first catalytic particle on a substrate surface, and growing a first nanowhisker by the VLS process via each said first catalytic particle; and
n following stages, where n is an integer greater than or equal to 2, and each following stage includes depositing on a peripheral surface of at least one preceding nanowhisker grown in the preceding stage, at least one further catalytic particle, and
growing by the VLS process, from each further catalytic particle, a further nanowhisker extending transversely from the peripheral surface of the respective preceding nanowhisker,
wherein, in each of the following stages, the depositing the further catalytic particles on the preceding nanowhiskers comprises electrostatically precipitating the further catalytic particles on the peripheral surface of the at least one preceding nanowhisker.

91. A method as claimed in claim 90, wherein the further catalytic particles are generally evenly distributed on the peripheral surface of each preceding nanowhisker, in a circumferential direction of the preceding nanowhisker.

92. A method as claimed in claim 90, wherein the further catalytic particles are generally evenly distributed on the peripheral surface of each preceding nanowhisker, in a lengthwise direction of the preceding nanowhisker.

93. A method as claimed in claim 90, wherein a length of the further nanowhisker is a function of a time of the growing the further nanowhisker.

94. A method as claimed in claim 90, wherein a length of the further nanowhisker is a function a reagent concentration in said growing the second nanowhisker.

95. A method as claimed in claim 90, wherein a length of the further nanowhisker is a function of a temperature of the growing of the further nanowhisker.

96. A method as claimed in claim 90, wherein a length of the further nanowhiskers is controlled to within ±5% a of a desired length.

97. A method as claimed in claim 90, wherein an orientation of the further nanowhiskers is determined by a crystal direction of the preceding nanowhiskers.

98. A method of forming a nanostructure, comprising:
a first stage which includes providing at least one first catalytic particle on a substrate, and forming a first one-dimensional nanoelement via each said first catalytic particle; and
a second stage which includes depositing on a peripheral surface of at least one said first one-dimensional nanoelement, at least one second catalytic particle, and forming from each said second catalytic particle, a second one-dimensional nanoelement extending transversely from the peripheral surface of the respective first one-dimensional nanoelement,
wherein the providing comprises electrostatically precipitating the first catalytic particles on the substrate.

99. The method as claimed in claim 98, further comprising a third stage which includes depositing on a peripheral surface of at least one said second one-dimensional nanoelement, at least one third catalytic particle, and growing by the VLS process, from each third catalytic particle, a third one-dimensional nanoelement extending transversely from the peripheral surface of the respective second one-dimensional nanoelement.

100. A method as claimed in claim 98, wherein the depositing the second catalytic particles on the first one-dimensional nanoelements comprises forming an aerosol flow comprising the second catalytic particles and depositing the second catalytic particle on the peripheral surface of the first one-dimensional nanoelement from the aerosol flow.

101. A method as claimed in claim 100, wherein the depositing the second catalytic particles on the first one-dimensional nanoelements comprises electrostatically precipitating the second catalytic particles on the peripheral surface of the first one-dimensional nanoelement.

102. A method as claimed in claim 100, wherein the depositing the second catalytic particles on the first one-dimensional nanoelement comprises controlling a density of the aerosol flow to achieve a desired number of the second catalytic particles on each first one-dimensional nanoelement.

103. A method as claimed in claim 102, wherein the number of the second catalytic particles that is deposited on each first one-dimensional nanoelement is the same to within ±10%.

104. A method as claimed in claim 100, wherein the second catalytic particles on the peripheral surface of each first one-dimensional nanoelement are generally evenly distributed on the peripheral surface, in a circumferential direction of the respective first one-dimensional nanoelement.

105. A method as claimed in claim 100, wherein the second catalytic particles are generally evenly distributed on the peripheral surface of each first one-dimensional nanoelement, in a lengthwise direction of the respective first one-dimensional nanoelement.

106. A method of forming a nanostructure, comprising:
  a first stage which includes providing at least one first catalytic particle on a substrate, and forming a first one-dimensional nanoelement via each said first catalytic particle; and
  a second stage which includes depositing on a peripheral surface of at least one said first one-dimensional nanoelement, at least one second catalytic particle, and forming from each said second catalytic particle, a second one-dimensional nanoelement extending transversely from the peripheral surface of the respective first one-dimensional nanoelement,
  wherein the depositing the second catalytic particles on the first one-dimensional nanoelements comprises forming an aerosol flow comprising the second catalytic particles and depositing the second catalytic particle on the peripheral surface of the first one-dimensional nanoelement from the aerosol flow.

107. The method as claimed in claim 106, further comprising a third stage which includes depositing on a peripheral surface of at least one said second one-dimensional nanoelement, at least one third catalytic particle, and growing by the VLS process, from each third catalytic particle, a third one-dimensional nanoelement extending transversely from the peripheral surface of the respective second one-dimensional nanoelement.

108. A method as claimed in claim 106, wherein the depositing the second catalytic particles on the first one-dimensional nanoelements comprises electrostatically precipitating the second catalytic particles on the peripheral surface of the first one-dimensional nanoelement.

109. A method as claimed in claim 106, wherein the depositing the second catalytic particles on the first one-dimensional nanoelement comprises controlling a density of the aerosol flow to achieve a desired number of the second catalytic particles on each first one-dimensional nanoelement.

110. A method as claimed in claim 109, wherein the number of the second catalytic particles that is deposited on each first one-dimensional nanoelement is the same to within ±10%.

111. A method as claimed in claim 106, wherein the second catalytic particles on the peripheral surface of each first one-dimensional nanoelement are generally evenly distributed on the peripheral surface, in a circumferential direction of the respective first one-dimensional nanoelement.

112. A method as claimed in claim 106, wherein the second catalytic particles are generally evenly distributed on the peripheral surface of each first one-dimensional nanoelement, in a lengthwise direction of the respective first one-dimensional nanoelement.

* * * * *

UNITED STATES PATENT AND TRADEMARK OFFICE
CERTIFICATE OF CORRECTION

PATENT NO. : 7,662,706 B2  Page 1 of 1
APPLICATION NO. : 10/986438
DATED : February 16, 2010
INVENTOR(S) : Samuelson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1445 days.

Signed and Sealed this

Thirtieth Day of November, 2010

David J. Kappos
*Director of the United States Patent and Trademark Office*